US012289105B2

(12) United States Patent
Choi et al.

(10) Patent No.: US 12,289,105 B2
(45) Date of Patent: Apr. 29, 2025

(54) ELECTRONIC DEVICE, OPERATING METHOD THEREOF, AND ELECTRONIC SYSTEM

(71) Applicant: Samsung Electronics Co., Ltd., Suwon-si (KR)

(72) Inventors: Youngho Choi, Suwon-si (KR); Donghyuk Lim, Suwon-si (KR); Kibaek Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/514,975

(22) Filed: Nov. 20, 2023

(65) Prior Publication Data

US 2024/0178845 A1 May 30, 2024

(30) Foreign Application Priority Data

Nov. 28, 2022 (KR) ........................ 10-2022-0162030

(51) Int. Cl.
| | |
|---|---|
| *H03K 21/00* | (2006.01) |
| *H03K 5/13* | (2014.01) |
| *H03K 5/24* | (2006.01) |
| *H03K 19/21* | (2006.01) |

(52) U.S. Cl.
CPC ............. *H03K 21/00* (2013.01); *H03K 5/13* (2013.01); *H03K 5/24* (2013.01); *H03K 19/21* (2013.01)

(58) Field of Classification Search
CPC ......... H03L 7/093; H03L 7/085; H03L 7/091; H04L 7/0331; H04L 7/033; H04L 7/02
See application file for complete search history.

(56) References Cited

U.S. PATENT DOCUMENTS

| | | |
|---|---|---|
| 7,746,969 B2 | 6/2010 | Bryan et al. |
| 9,306,730 B1 | 4/2016 | Shu et al. |
| 9,312,865 B2 | 4/2016 | Song et al. |

(Continued)

FOREIGN PATENT DOCUMENTS

| | | |
|---|---|---|
| CN | 115378564 A | 11/2022 |
| EP | 2779459 A1 | 9/2014 |

OTHER PUBLICATIONS

Zhang Zhaoyu et al: "A 0.006-mm26-to-20-GB/s NRZ Bang-Bang Clock and Data Recovery Circuit With Dual-Path Loop", 2022 IEEE Asia Pacific Conference on Circuits and Systems (APCCAS), IEEE, Nov. 11, 2022 (Nov. 11, 2022), pp. 556-559, XP034327952, DOI: 10.1109/APCCAS55924.2022.10090393 [retrieved on Apr. 12, 2023].

(Continued)

*Primary Examiner* — Diana J. Cheng
(74) *Attorney, Agent, or Firm* — Harness, Dickey & Pierce, P.L.C.

(57) ABSTRACT

An electronic device includes a first sample circuit configured to generate a first sampling signal by sampling an input signal in response to edges of a clock signal, a first comparator configured to generate a first logic decision signal by comparing a voltage level of the first sampling signal with a reference voltage level, an analog bang-bang phase detector configured to generate a first detection signal by executing an exclusive OR (XOR) operation on successive samples of the first logic decision signal, and a digitally controlled oscillator configured to vary a frequency of the clock signal according to the first detection signal.

20 Claims, 16 Drawing Sheets

(56) References Cited

U.S. PATENT DOCUMENTS

| | | |
|---|---|---|
| 9,331,822 B1 | 5/2016 | Chang et al. |
| 10,135,605 B2 | 11/2018 | Yoo et al. |
| 10,409,322 B2 * | 9/2019 | Liang .................... H03K 19/23 |
| 10,523,328 B2 | 12/2019 | Gopalakrishnan |
| 10,868,663 B1 | 12/2020 | Turker Melek et al. |
| 11,128,304 B1 | 9/2021 | Yao et al. |
| 11,277,254 B2 | 3/2022 | Lee et al. |
| 2021/0143824 A1 | 5/2021 | Kumar et al. |

OTHER PUBLICATIONS

Park K-Y et al : "Fully integrated serial-link receiver with optical interface for long-haul display interconnects", IET Circuits Devices and Systems, the Institution of Engineering and Technology, GB, vol. 6, No. 6, Nov. 23, 2012 (Nov. 23, 2012), pp. 375-385, XP006042498, ISSN: 1751-858X, DOI: 10.1049/IET-CDS.2012.0029.

European Search Report from corresponding European Application No. 23212178.0, dated Jun. 4, 2024.

* cited by examiner

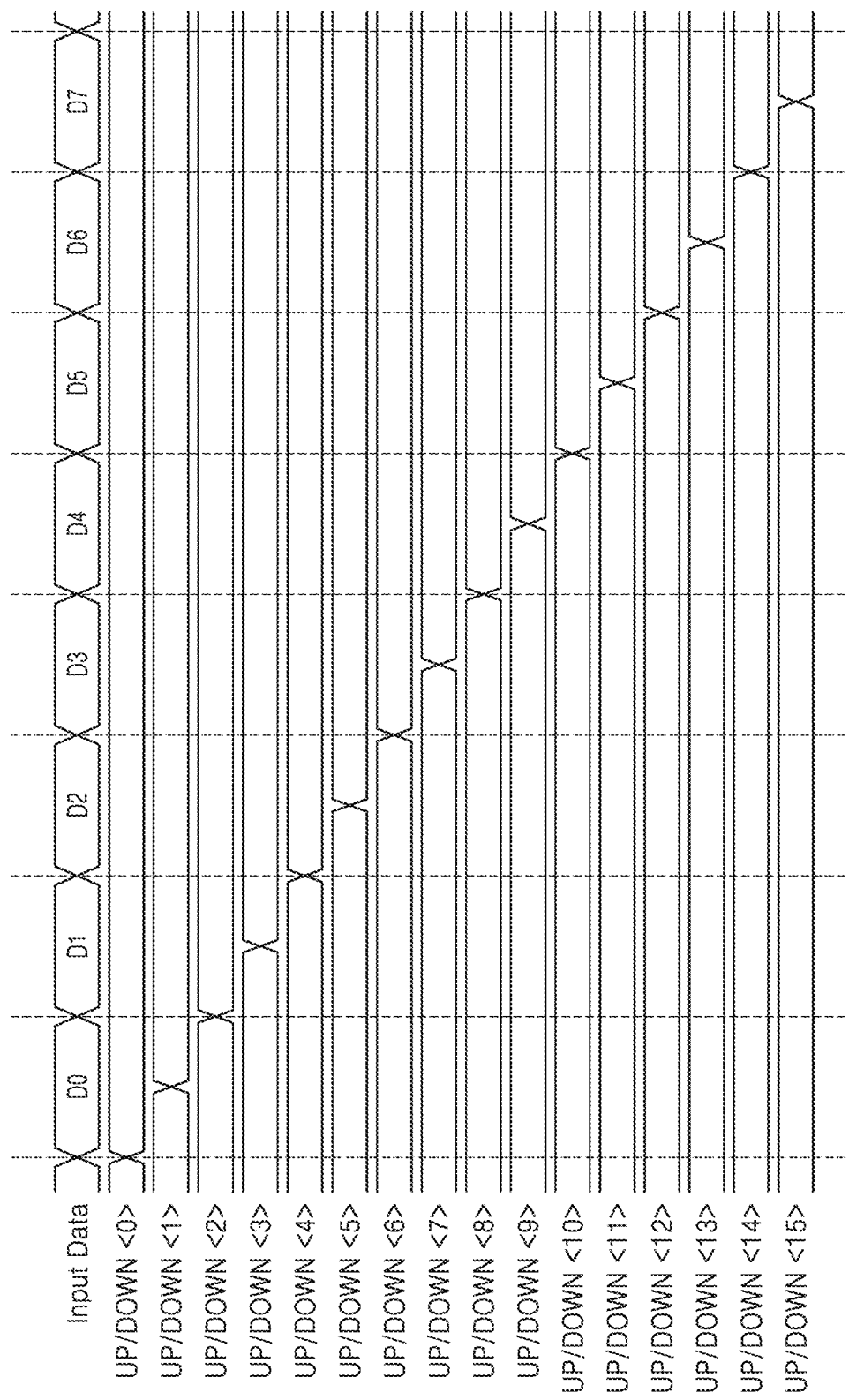

FIG. 13
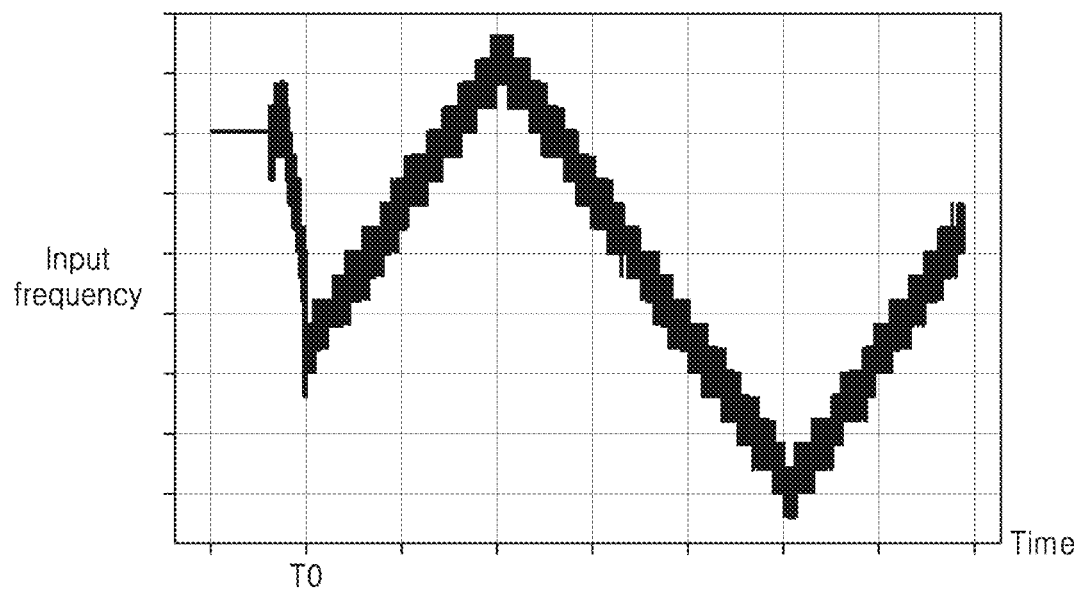
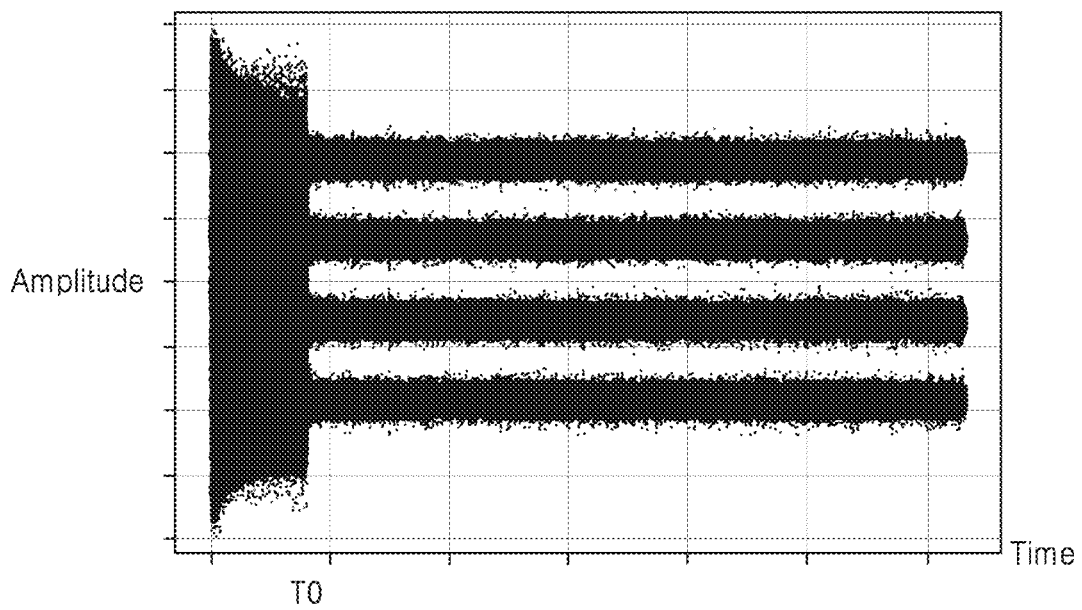

ELECTRONIC DEVICE, OPERATING METHOD THEREOF, AND ELECTRONIC SYSTEM

CROSS-REFERENCE TO RELATED APPLICATION

This application claims priority under 35 U.S.C. § 119 to Korean Patent Application No. 10-2022-0162030, filed on Nov. 28, 2022, in the Korean Intellectual Property Office, the disclosure of which is incorporated by reference herein in its entirety.

FIELD

The inventive concepts relate to an electronic device, including an electronic device configured to restore a digital clock signal, based on an analog input signal, and/or an operating method of the electronic device.

BACKGROUND

Instead of directly receiving a clock signal from a transmitting device, a receiving device may employ a clock and data recovery (CDR) circuit to restore a clock signal from a data signal received from the transmitting device. The CDR circuit may contribute to reducing the complexity of a communication channel between the transmitting device and the receiving device, and improving the rate of communication.

The clock signal may be related to the operation of an electronic device, and thus it may be important to accurately restore the clock signal using the CDR circuit. However, various factors, such as an increase in the rate of communication and a decrease in the size of the CDR circuit, make it more difficult to restore the clock signal. Moreover, due to circuit designs employing a plurality of communication lines and a plurality of clock signals to further increase the rate of communication and rapidly exchange large amounts of data, it is more difficult to accurately handle clock signals.

During a clock signal restoration process, the use of components such as an equalizer may increase latency necessary for restoring a clock signal. The term "latency" may refer to the time necessary for a receiving device to restore a clock signal from a received data signal. Long latency may make it difficult to increase the bandwidth of an electronic device due to stability issues. Therefore, methods of reducing latency necessary for restoring a clock signal have been studied for the development of an electronic device having a wide bandwidth.

SUMMARY

The inventive concepts provide an electronic device having a wide bandwidth by reducing latency when restoring a clock signal from an analog input signal.

According to an aspect of the inventive concepts, an electronic device includes a first sample circuit configured to generate a first sampling signal by sampling an input signal in response to edges of a clock signal, a first comparator configured to generate a first logic decision signal by comparing a voltage level of the first sampling signal with a reference voltage level, an analog bang-bang phase detector configured to generate a first detection signal by executing an exclusive OR (XOR) operation on successive samples of the first logic decision signal, and a digitally controlled oscillator configured to vary a frequency of the clock signal according to the first detection signal.

According to another aspect of the inventive concepts, an operating method of an electronic device comprising an analog bang-bang phase detector, includes generating a first sampling signal by sampling an input signal in response to edges of a clock signal, generating a first logic decision signal by comparing a voltage level of the first sampling signal with a reference voltage level, generating a first detection signal by the analog bang-bang phase detector performing an exclusive OR (XOR) operation on successive samples of the first logic decision signal, and varying a frequency of the clock signal according to the first detection signal.

According to another aspect of the inventive concepts, an electronic system includes a communication block configured to receive an input signal from a system external to the electronic system, and a main processor configured to process at least one of arithmetic or logical operations in the electronic system, wherein the communication block is configured to generate a first sampling signal by sampling the input signal in response to edges of a clock signal, generate a first logic decision signal by comparing a voltage level of the first sampling signal with a reference voltage level, generate a first detection signal, based on the first logic decision signal, and generate a clock signal having a frequency adjusted according to the first detection signal.

BRIEF DESCRIPTION OF THE DRAWINGS

Some example embodiments will be more clearly understood from the following detailed description taken in conjunction with the accompanying drawings in which:

FIG. 10 is a diagram illustrating first detection signals according to an example embodiment;

FIG. 13 is a diagram illustrating a digital signal according to an example embodiment.

DETAILED DESCRIPTION

Hereinafter, various example embodiments will be described with reference to the accompanying drawings.

Figure 1:
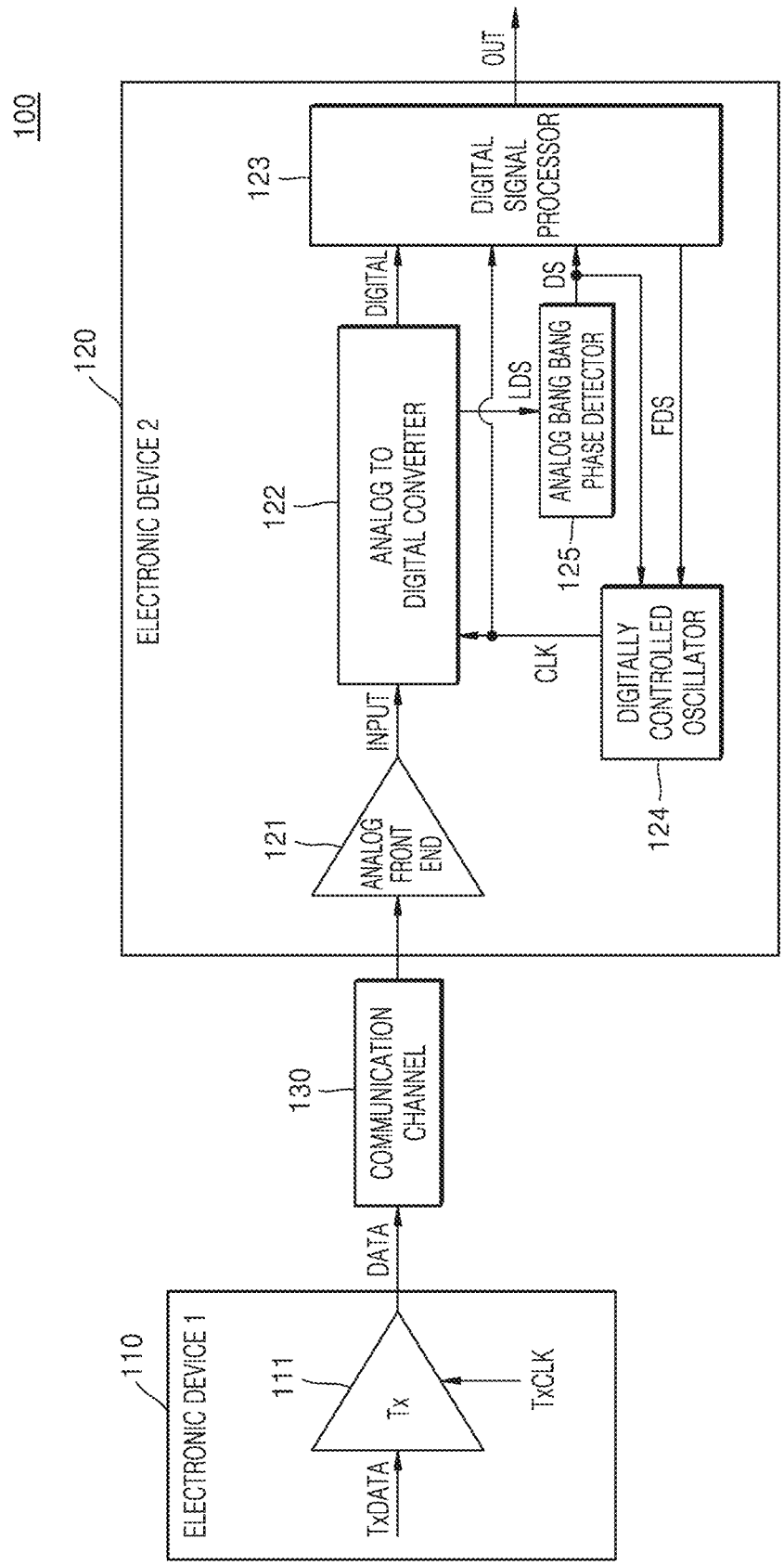
FIG. 1 is a diagram illustrating a communication environment between electronic devices according to an example embodiment.

FIG. 1 is a diagram illustrating a communication environment 100 between electronic devices according to an example embodiment.

The communication environment 100 between electronic devices may include a first electronic device 110, a second electronic device 120, and a communication channel 130.

The first electronic device 110 and the second electronic device 120 shown in FIG. 1 may be various types of electronic devices. For example, each of the first electronic device 110 and the second electronic device 120 may be one of a desktop computer, a laptop computer, a tablet computer, a smartphone, a wearable device, an electric vehicle, a workstation, and a server system. However, the inventive concepts are not limited thereto, and the first electronic device 110 and the second electronic device 120 may be configured as arbitrary electronic devices capable of communicating with each other. In some example embodiments, the first electronic device 110 may be referred to as a transmitting device, and the second electronic device 120 may be referred to as a receiving device.

The first electronic device 110 may communicate with the second electronic device 120 through the communication channel 130. The first electronic device 110 may include a transmitter 111. Data signal DATA may include transmission data TxDATA that is generated inside the first electronic device 110 for being transmitted to the second electronic device 120. For example, the transmitter 111 may output the data signal DATA in response to a transmission clock signal TxCLK. The data signal DATA output from the transmitter 111 may be provided to the second electronic device 120 through the communication channel 130.

The transmitter 111 may include various hardware circuits (for example, an amplification circuit, a modulation circuit, an encoder circuit, etc.) to output a signal corresponding to the transmission data TxDATA.

The transmitter 111 may be configured according to one or more of various interface protocols depending on the type of the communication channel 130. For example, the transmitter 111 may support at least one of various communication protocols such as a peripheral component interconnect express (PCIe), wireless fidelity (Wi-Fi), radio frequency identification (RFID), Bluetooth, long term evolution (LTE), new radio (NR), or the like.

The communication channel 130 may be a wired channel (for example, a wire, a cable, or the like) and/or a wireless channel (for example, air, water, or the like) for wired and/or wireless communication between the first electronic device 110 and the second electronic device 120.

The second electronic device 120 may include an analog front end 121, an analog-to-digital converter 122, a digital signal processor 123, a digitally controlled oscillator 124, and an analog bang-bang phase detector 125.

The analog front end 121 may include an amplifier circuit or the like. The analog front end 121 may generate an analog input signal INPUT to be provided to the analog-to-digital converter 122 by amplifying the data signal DATA received through the communication channel 130.

The analog-to-digital converter 122 may generate a sampling signal by sampling the analog input signal INPUT. The analog-to-digital converter 122 may generate a logic decision signal LDS by comparing the voltage level of the sampling signal with a reference voltage level. For example, when the reference voltage level is 0 [V] and the voltage level of the sampling signal is +1 [V], the analog-to-digital converter 122 may generate a logic decision signal LDS corresponding to a high logic level because the voltage level of the sampling signal is higher than the reference voltage level. In addition, when the reference voltage level is 0 [V] and the voltage level of the sampling signal is −1 [V], the analog-to-digital converter 122 may generate a logic decision signal LDS corresponding to a low logic level because the voltage level of the sampling signal is lower than the reference voltage level. In addition, the analog-to-digital converter 122 may generate a digital signal DIGITAL by re-sampling the sampling signal.

The analog bang-bang phase detector 125 may generate a detection signal DS through an exclusive OR (XOR) operation between successive samples of the logic decision signal LDS. The operation of the analog bang-bang phase detector 125 will be described with reference to FIGS. 9A and 9B.

The digital signal processor 123 may low-pass filter the detection signal DS received from the analog bang-bang phase detector 125 to generate a filtered detection signal FDS. The digital signal processor 123 may also generate an output signal OUT, which includes the digital signal DIGITAL received from the analog-to-digital converter 122 or a clock signal CLK received from the digitally controlled oscillator 124.

The digitally controlled oscillator 124 may generate a clock signal CLK having a frequency varied according to the detection signal DS received from the analog bang-bang phase detector 125 or the filtered detection signal FDS received from the digital signal processor 123.

As described above, the second electronic device 120 may generate a clock signal CLK corresponding to the transmission clock signal TxCLK based on the data signal DATA received from the first electronic device 110.

Figure 2:
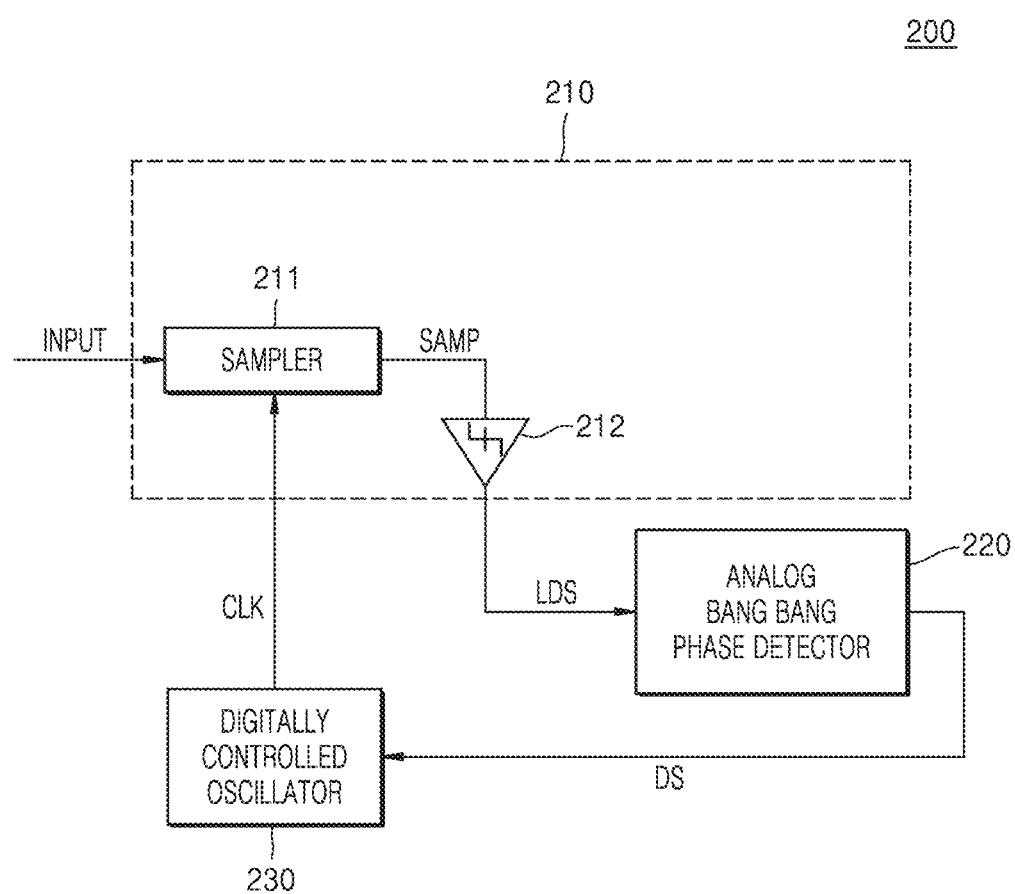
FIG. 2 is a block diagram illustrating an electronic device according to an example embodiment.

FIG. 2 is a block diagram illustrating an electronic device 200 according to an example embodiment. In the following description of FIG. 2, those described with reference to FIG. 1 may not be described.

Referring to FIG. 2, the electronic device 200 may include an analog-to-digital converter 210, an analog bang-bang phase detector 220, and a digitally controlled oscillator 230.

The analog-to-digital converter 210 may include a sampler 211 and a comparator 212.

The sampler 211 may generate a sampling signal SAMP by sampling an input signal INPUT in response to edges of a clock signal CLK. The input signal INPUT may be provided to the sampler 211 through an analog front end (for example, refer to the analog front end 121 shown in FIG. 1). The sampler 211 may be a track and hold circuit configured to sample an input signal INPUT and then output a signal having the same or substantially the same voltage level as the input signal INPUT for a predetermined clock period.

The comparator 212 may generate a logic decision signal LDS by comparing the voltage level of the sampling signal SAMP with a reference voltage level. The comparator 212 may generate a logic decision signal LDS corresponding to a high level or a low level by comparing the voltage level of the sampling signal SAMP with the reference voltage level. For example, when the reference voltage level is 0 [V] and the voltage level of the sampling signal SAMP is +1 [V], the comparator 212 may generate a logic decision signal LDS corresponding to a high logic level because the voltage level of the sampling signal SAMP is higher than the reference voltage level. In addition, when the reference voltage level is 0 [V] and the voltage level of the sampling signal SAMP is −1 [V], the comparator 212 may generate a logic decision signal LDS corresponding to a low logic level because the voltage level of the sampling signal SAMP is lower than the reference voltage level. However, this is merely an example, and the reference voltage level may be set differently in other example embodiments. In addition, when the voltage level of the sampling signal SAMP is higher than the reference voltage level, the comparator 212 may generate a logic decision signal LDS corresponding to a low logic level. Similarly, when the voltage level of the sampling signal SAMP is lower than the reference voltage level, the comparator 212 may generate a logic decision signal LDS corresponding to a high logic level.

As described above, the analog bang-bang phase detector 220 may generate a detection signal DS by executing an XOR operation on consecutive samples of the logic decision signal LDS. The detection signal DS may indicate whether the clock signal CLK is faster or slower than the input signal INPUT.

The digitally controlled oscillator 230 may generate a clock signal CLK having a frequency varied according to the detection signal DS. For example, when the detection signal DS corresponds to a slow clock signal CLK, the digitally controlled oscillator 230 may generate a clock signal CLK having a frequency increased according to the detection signal DS. In addition, when the detection signal DS corresponds to a fast clock signal CLK, the digitally controlled oscillator 230 may generate a clock signal CLK having a frequency decreased according to the detection signal DS.

As described above, the electronic device 200 may restore a clock signal CLK based on the input signal INPUT by adjusting a frequency output by the digitally controlled oscillator 230.

Figure 3:
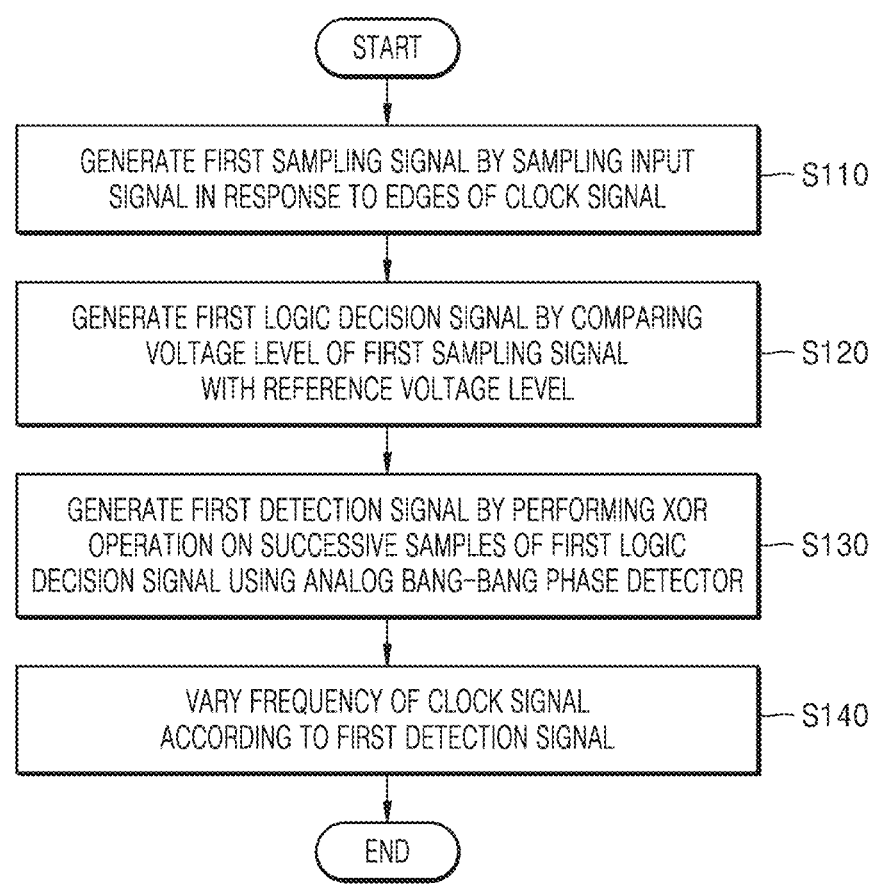
FIG. 3 is a flowchart illustrating an operating method of an electronic device according to an example embodiment.

FIG. 3 is a flowchart illustrating an operating method of an electronic device according to an example embodiment.

In operation S110, the electronic device may generate a first sampling signal by sampling an input signal in response to edges of a clock signal. For example, the electronic device may generate the first sampling signal by sampling the input signal in response to rising edges of the clock signal. For example, when the clock signal has a rising edge at time t1 and the input signal has a first voltage level at time t1, the electronic device may generate the first sampling signal having the first voltage level.

In operation S120, the electronic device may generate a first logic decision signal by comparing the voltage level of the first sampling signal with a reference voltage level. The electronic device may generate a first logic decision signal corresponding to a high level or a low level by comparing the voltage level of the first sampling signal with the reference voltage level. For example, when the voltage level of the first sampling signal is higher than the reference voltage level, the electronic device may generate a first logic decision signal corresponding to a high logic level. In addition, when the voltage level of the first sampling signal is lower than the reference voltage level, the electronic device may generate a first logic decision signal corresponding to a low logic level.

In operation S130, the electronic device may generate a first detection signal by performing an XOR operation on successive samples of the first logic decision signal by using an analog bang-bang phase detector. The first detection signal may indicate whether the clock signal is fast or slow.

In operation S140, the electronic device may vary the frequency of the clock signal according to the first detection signal. For example, when the first detection signal corresponds to a slow clock signal, the electronic device may generate a clock signal having a frequency increased according to the first detection signal. In addition, when the first detection signal corresponds to a fast clock signal, the electronic device may generate a clock signal having a frequency decreased according to the first detection signal.

In some example embodiments, the operating method may further include: generating a second sampling signal by sampling the input signal in response to edges of an inverted clock signal having a phase opposite to the phase of the clock signal; generating a second logic decision signal by comparing the voltage level of the second sampling signal with the reference voltage level; and providing one of the first logic decision signal and the second logic decision signal to the analog bang-bang phase detector in response to a selection signal.

In other example embodiments, the operating method may further include: generating multi-phase clock signals by adjusting the phase of the clock signal; and generating a frequency-divided clock signal by dividing the frequency of any one of the clock signal and the multi-phase clock signals.

In other example embodiments, the operating method may further include: generating a delayed sampling signal by sampling the first sampling signal; and converting the delayed sampling signal into a digital signal; and generating an output signal by processing the digital signal.

Figure 4:
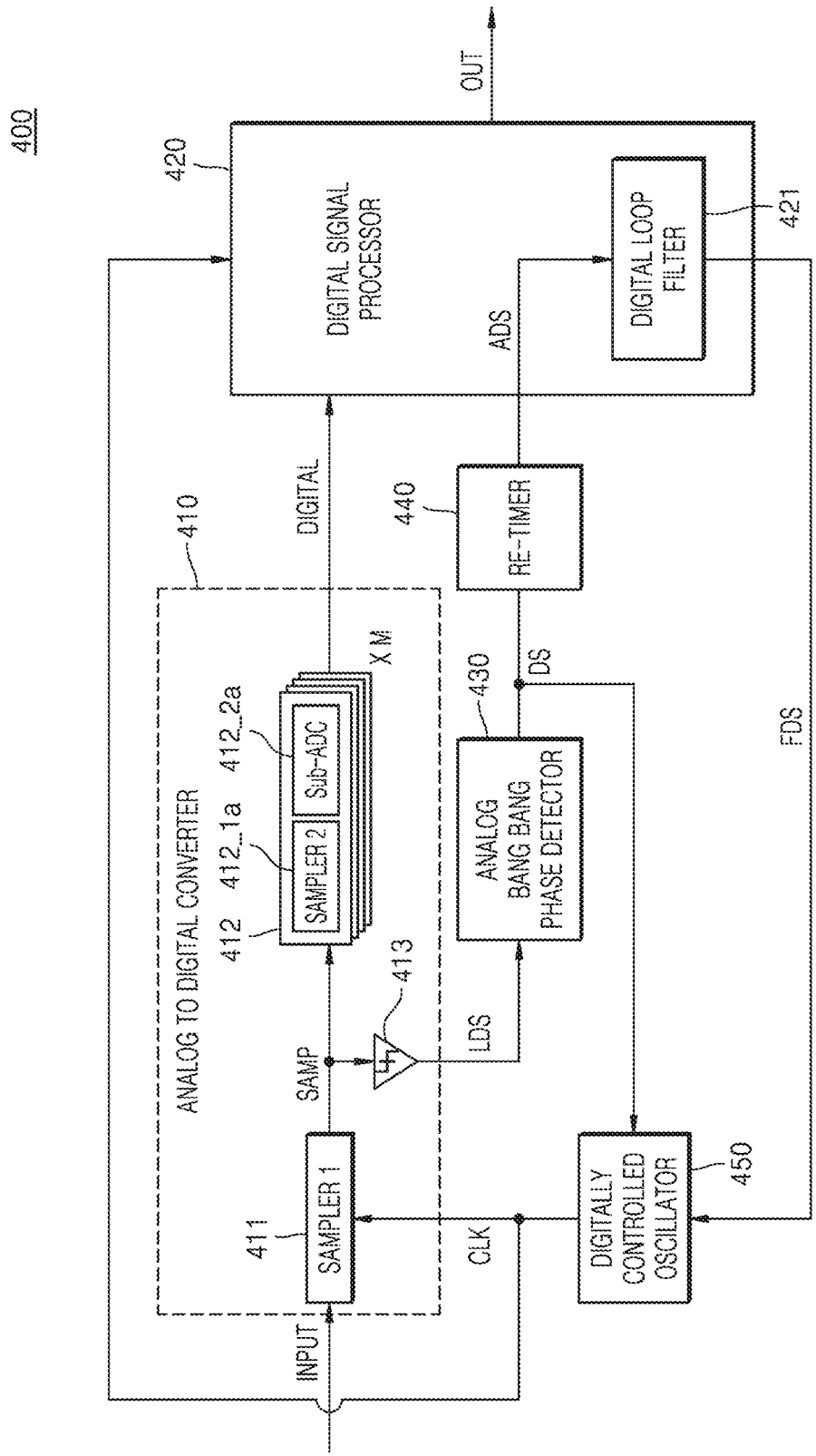
FIG. 4 is a block diagram illustrating an electronic device according to another example embodiment.

FIG. 4 is a block diagram illustrating an electronic device 400 according to another example embodiment. In the following description of FIG. 4, those described with reference to FIGS. 1 and 2 may not be described.

Referring to FIG. 4, the electronic device 400 may include an analog-to-digital converter 410, a digital signal processor 420, an analog bang-bang phase detector 430, a re-timer 440, and a digitally controlled oscillator 450.

Compared with the electronic device 200 described with reference to FIG. 2, the electronic device 400 shown in FIG. 4 may further include a digital signal processor 420 and a re-timer 440.

The analog-to-digital converter 410 may include a first sampler 411, signal converters 412, and a comparator 413.

The first sampler 411 may generate a sampling signal SAMP by sampling an input signal INPUT in response to edges of a clock signal CLK.

The number of signal converters 412 may be one or more, for example, M (where M may be a natural number greater than or equal to 1). Each of the signal converters 412 may include a second sampler 412_1a and a sub-analog-to-digital converter 412_2a. The second sampler 412_1a may generate a delayed sampling signal SAMP by delaying the sampling signal SAMP at a rate at which the sub-analog-to-digital converter 412_2a may operate. The sub-analog-to-digital converter 412_2a may convert the delayed sampling signal SAMP into a digital signal DIGITAL. A clock rate corresponding to the sampling signal SAMP may be different from a rate at which the sub-analog-to-digital converter 412_2a may operate. For example, M may be 4, and the clock rate corresponding to the sampling signal SAMP may be four times the rate at which the sub-analog-to-digital converter 412_2a may operate. In some example embodiments, the second sampler 412_1a may generate a delayed sampling signal by delaying the sampling signal SAMP by a factor of 4. Each of the four sub-analog-to-digital converters 412_2a may convert the delayed sampling signal into a digital signal DIGITAL. The digital signal DIGITAL may refer to a signal obtained by converting the input signal INPUT, which is an analog signal, into a digital value.

The comparator 413 may generate a logic decision signal LDS by comparing the voltage level of the sampling signal SAMP with a reference voltage level.

The analog bang-bang phase detector 430 may generate a detection signal DS through an XOR operation between successive samples of the logic decision signal LDS. The analog bang-bang phase detector 430 may provide the detection signal DS to the digitally controlled oscillator 450 and the re-timer 440.

The re-timer 440 may generate an aligned detection signal ADS by aligning the timing of the detection signal DS. As shown in FIG. 10, detection signals DS may be sequentially output by the analog bang-bang phase detector 430 while the input signal INPUT is converted into the digital signal DIGITAL. The sequentially-output detection signals DS may be aligned such that the sequentially-output detection signals DS may pass through a digital loop filter 421. The re-timer 440 may generate the aligned detection signal ADS by aligning the timings of the sequentially-output detection signals DS like simultaneously-output signals.

The digital signal processor 420 may include the digital loop filter 421. The digital loop filter 421 may perform low-pass filtering on the aligned detection signal ADS received from the re-timer 440 to generate a filtered detection signal FDS. In addition, the digital signal processor 420 may generate an output signal OUT including the digital signal DIGITAL received from the analog-to-digital converter 410 and the clock signal CLK received from the digitally controlled oscillator 450.

The digitally controlled oscillator 450 may generate a clock signal CLK having a frequency varied according to the detection signal DS and the filtered detection signal FDS. For example, when the detection signal DS corresponds to increasing the frequency of the clock signal CLK by 2 MHz and the filtered detection signal FDS corresponds to increasing the frequency of the clock signal CLK by 1 MHz, the digitally controlled oscillator 450 may increase the frequency of the clock signal CLK by a total of 3 MHz and may the output the clock signal CLK.

Figure 5:
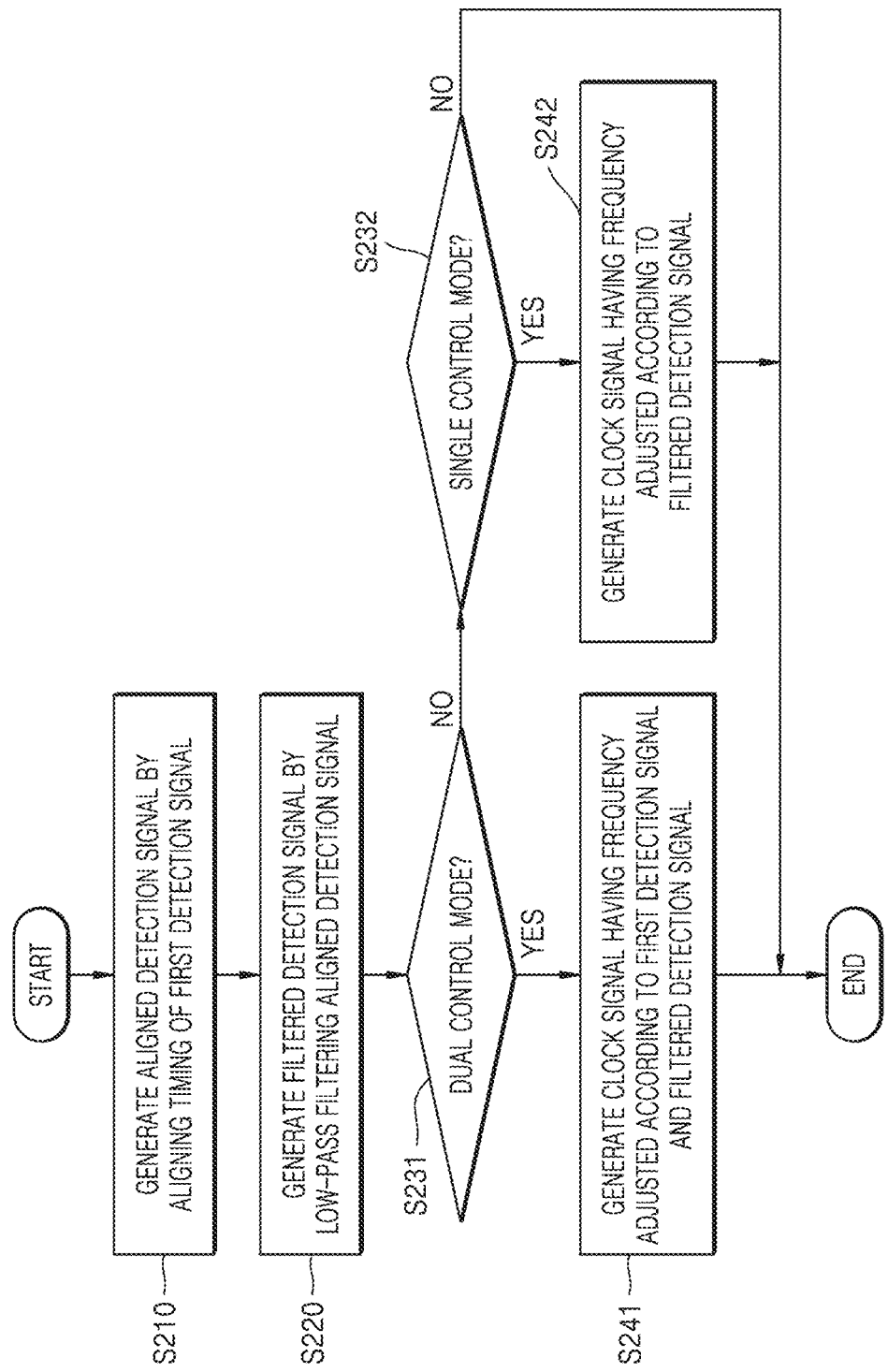
FIG. 5 is a flowchart illustrating an operating method of an electronic device according to another example embodiment.

FIG. 5 is a flowchart illustrating an operating method of an electronic device according to another example embodiment. FIG. 5 may be described with reference to FIGS. 3 and 4. Operations S210 to S242 of FIG. 5 may be performed after operation S130 of FIG. 3. In other words, operations prior to operation S210 of FIG. 5 may overlap operations S110 to S130 of FIG. 3 and are thus omitted from FIG. 5.

In operation S210, the electronic device may generate an aligned detection signal by aligning the timing of the first detection signal. As shown in FIG. 10, first detection signals may be sequentially output by an analog bang-bang phase detector while the input signal is converted into a digital signal. The electronic device may generate the aligned detection signal by aligning the timings of the sequentially-output detection signals like simultaneously-output signals.

In operation S220, the electronic device may perform low-pass filtering on the aligned detection signal to generate a filtered detection signal.

As described above, because the electronic device performs low-pass filtering on the aligned detection signal, signals having a frequency higher than a specific value may be attenuated to remove noise components and inhibit or prevent a sudden frequency change of the clock signal.

In operation S231, the electronic device may determine whether an operation mode signal has a dual control mode voltage level corresponding to a dual control mode. When the operation mode signal has the dual control mode voltage level corresponding to the dual control mode, operation S241 may be performed, and when the operation mode signal does not have the dual control mode voltage level, operation S232 may be performed.

In operation S241, the electronic device may generate a clock signal having a frequency adjusted according to the first detection signal and the filtered detection signal. For example, when the first detection signal corresponds to increasing the frequency of the clock signal by 2 MHz and the filtered detection signal corresponds to increasing the frequency of the clock signal by 1 MHz, a digitally controlled oscillator may increase the frequency of the clock signal by a total of 3 MHz and may output the clock signal.

In operation S232, the electronic device may determine whether the operation mode signal has a single control mode voltage level corresponding to a single control mode. When the operation mode signal has the single control mode voltage level corresponding to the single control mode, operation S242 may be performed, and when the operation mode signal does not have the single control mode voltage level corresponding to the single control mode, the operating method of the current embodiment may be terminated.

In operation S242, the electronic device may generate a clock signal having a frequency adjusted according to the filtered detection signal. For example, when the filtered detection signal corresponds to increasing the frequency of the clock signal by 1 MHz, the digitally controlled oscillator may increase the frequency of the clock signal by 1 MHz and may output the clock signal.

As described above, the electronic device may restore a clock signal corresponding to an input signal by adjusting the frequency of the clock signal according to the voltage level of the operation mode signal.

Figure 6:
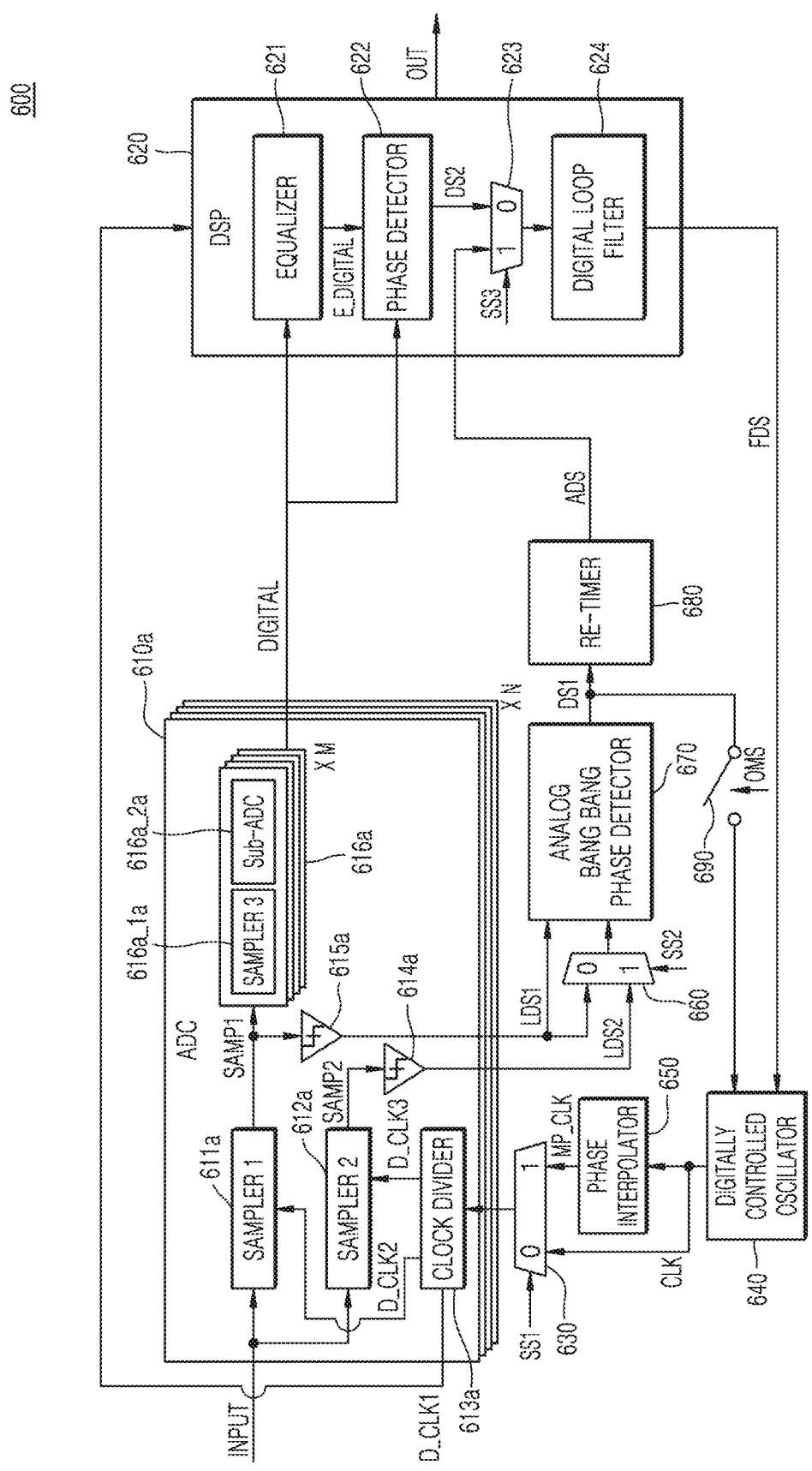
FIG. 6 is a block diagram illustrating an electronic device according to another example embodiment.

FIG. 6 is a block diagram illustrating an electronic device 600 according to another example embodiment. In the following description of FIG. 6, those described with reference to FIGS. 1 to 5 may not be described.

Referring to FIG. 6, the electronic device 600 may include analog-to-digital converters 610a, a digital signal processor 620, a first selector 630, a digitally controlled oscillator 640, a phase interpolator 650, a second selector 660, an analog bang-bang phase detector 670, a re-timer 680, and a switch 690. Here, the number of analog-to-digital converters 610a may be N (N is a natural number greater than or equal to 1).

Compared with the electronic device 400 shown in FIG. 4, the electronic device 600 shown in FIG. 6 may further include the first selector 630, the phase interpolator 650, the second selector 660, and the switch 690.

Each of the analog-to-digital converters 610a may include a first sampler 611a, a second sampler 612a, a clock divider 613a, a first comparator 615a, a second comparator 614a, and signal converters 616a.

The clock divider 613a may divide the frequency of a signal selected by the first selector 630 to generate first to third frequency-divided clock signals D_CLK1 to D_CLK3. The clock divider 613a may generate clock signals having frequencies desired or required by components of the electronic device 600. In other words, the clock divider 613a may generate the first clock signal D_CLK1 corresponding to a frequency desired or required by the digital signal processor 620, the second clock signal D_CLK2 corresponding to a frequency desired or required by the first sampler 611a, the third clock signal D_CLK3 corresponding to a frequency desired or required by the second sampler 612a.

Figure 7A:
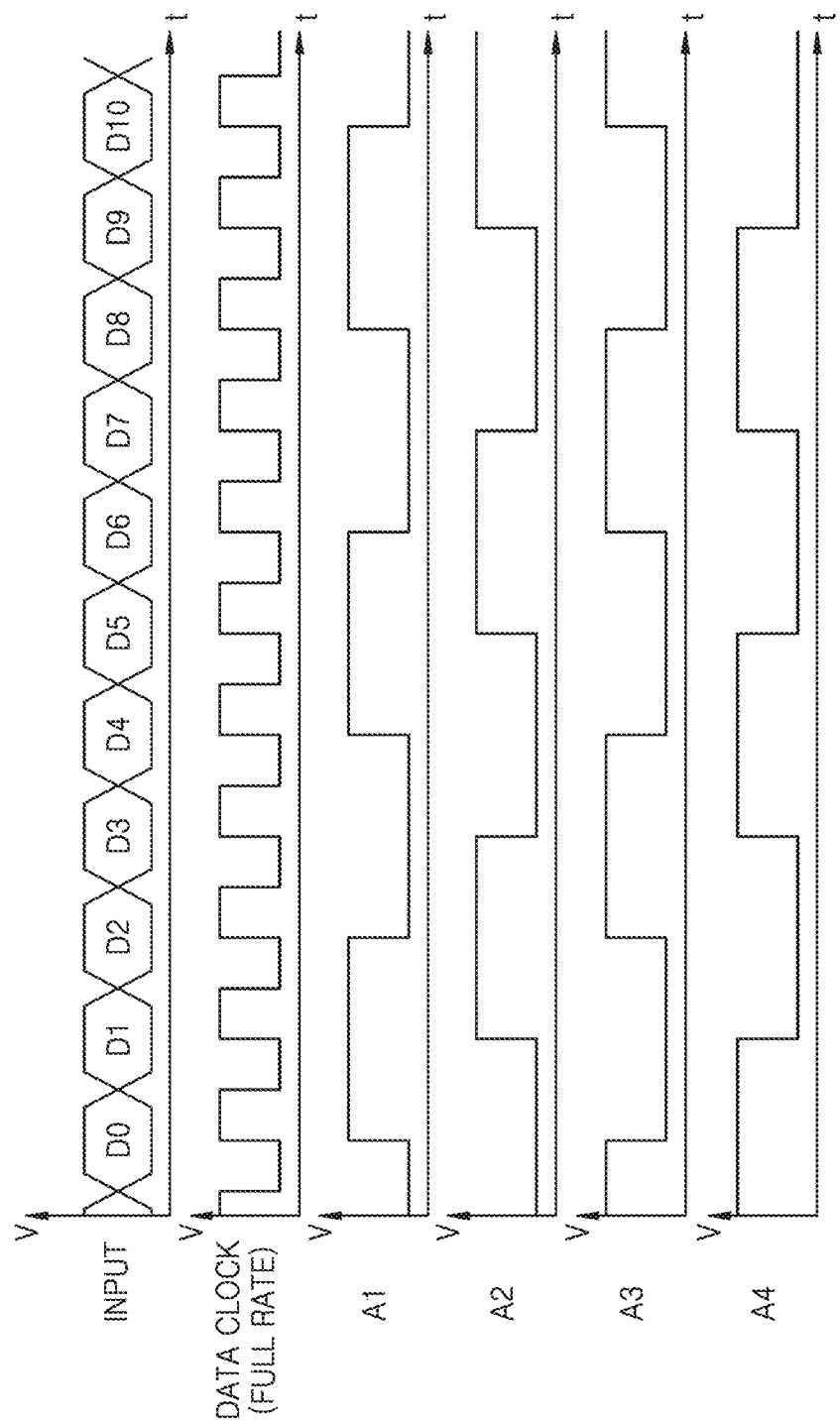
FIGS. 7A and 7B are timing diagrams illustrating a data clock and an edge clock, according to example embodiments.

The first sampler 611a may generate a first sampling signal SAMP1 by sampling an input signal INPUT in response to edges of the second frequency-divided clock signal D_CLK2. The second frequency-divided clock signal D_CLK2 may be a signal for sampling data of the input signal INPUT. In other words, as shown in FIG. 7A, the second frequency-divided clock signal D_CLK2 may be a signal having rising edges at centers of sequentially input signals INPUT.

Figure 7B:
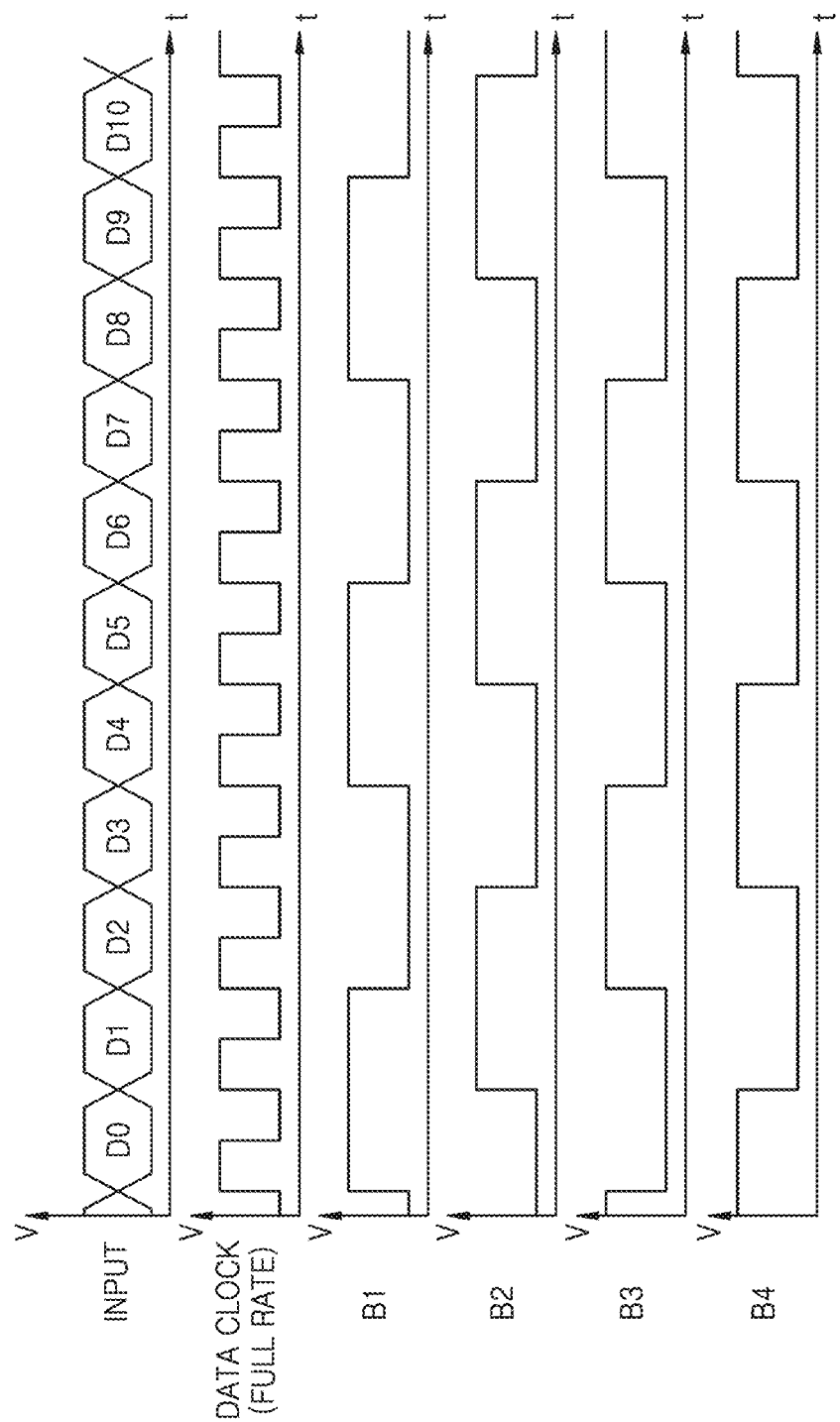

The third frequency-divided clock signal D_CLK3 may be a signal for sampling edges of the input signal INPUT. In other words, as shown in FIG. 7B, the third frequency-divided clock signal D_CLK3 may be a signal having rising edges at edges of sequentially input signals INPUT. The second frequency-divided clock signal D_CLK2 and the third frequency-divided clock signal D_CLK3 may have opposite phases as shown in FIGS. 7A and 7B. Because the third frequency-divided clock signal D_CLK3 has a phase opposite to the phase of the second frequency-divided clock signal D_CLK2, the third frequency-divided clock signal D_CLK3 may also be referred to as an inverted clock signal of the second frequency-divided clock signal D_CLK2.

In some example embodiments, the first sampler 611a may sample the input signal INPUT at rising edges of the second frequency-divided clock signal D_CLK2, and the second sampler 612l may sample the input signal INPUT at rising edges of the third frequency-divided clock signal D_CLK3. However, this is merely an example. For example, the first sampler 611a may sample the input signal INPUT at falling edges of the second frequency-divided clock signal D_CLK2, and the second sample 612a may sample the input signal INPUT at falling edges of the third frequency-divided clock signal D_CLK3.

The second sampler 612a may generate a second sampling signal SAMP2 by sampling the input signal INPUT in response to edges of the third frequency-divided clock signal D_CLK3.

The first comparator 615a may generate a first logic decision signal LDS1 by comparing the voltage level of the first sampling signal SAMP1 with a reference voltage level.

The second comparator 614a may generate a second logic decision signal LDS2 by comparing the voltage level of the second sampling signal SAMP2 with the reference voltage level.

The number of signal converters 616a may be one or more, for example, M (where M is a natural number greater than or equal to 1). According to various example embodiments, M, which is the number of signal converters 616a, and N, which is the number of analog-to-digital converters 610a, may vary. For example, when the input signal INPUT is a 32-bit signal and N is 8, M may be 4. However, this is merely an example, and the values of M and N may be set differently in other example embodiments.

Each of the signal converters 616a may include a third sampler 616a1a and a sub-analog-to-digital converter 616a2a. The third sampler 616a1a may generate a delayed sampling signal by delaying the first sampling signal SAMP1 at a rate at which the sub-analog-to-digital converter 616a2a may operate. The sub-analog-to-digital converter 616a2a may convert the delayed sampling signal into a digital signal DIGITAL. A clock rate corresponding to the first sampling signal SAMP1 may be different from a rate at which the sub-analog-to-digital converter 616a2a may operate. For example, M may be 4, and the clock rate corresponding to the first sampling signal SAMP1 may be 4 times the rate at which the sub-analog-to-digital converter 616a2a may operate. In some example embodiments, the third sampler 616a2a may generate the delayed sampling signal by delaying the first sampling signal SAMP1 by a factor of 4. Each of the four sub-analog-to-digital converters 616a2a may convert the delayed sampling signal into a digital signal DIGITAL. The digital signal DIGITAL may be a signal obtained by converting the input signal INPUT, which is an analog signal, into a digital value.

The analog bang-bang phase detector 670 may generate a first detection signal DS1 through an XOR operation between successive samples of the first logic decision signal LDS1 or the second logic decision signal LDS2. The analog bang-bang phase detector 670 may provide the first detection signal DS1 to the digitally controlled oscillator 640 and the re-timer 680.

The re-timer 680 may generate an aligned detection signal ADS by aligning the timing of the first detection signal DS1. As shown in FIG. 10, first detection signals DS1 may be sequentially output by the analog bang-bang phase detector 670 while the input signal INPUT is converted into a digital signal. The sequentially-output detection signals DS may be aligned such that the sequentially-output detection signals DS may pass through a digital loop filter 624. The re-timer 680 may generate the aligned detection signal ADS by aligning the timings of the sequentially-output detection signals DS like simultaneously-output signals.

The digital signal processor 620 may include an equalizer 621, a phase detector 622, a third selector 623, and the digital loop filter 624.

The equalizer 621 may generate an equalized digital signal E_DIGITAL by equalizing frequency attenuations of components of the digital signal DIGITAL.

The phase detector 622 may detect a phase difference between the equalized digital signal E_DIGITAL and the digital signal DIGITAL, and may generate a second detection signal DS2 corresponding to the phase difference.

The third selector 623 may select either the second detection signal DS2 or the aligned detection signal ADS in response to a third selection signal SS3. A processor (not shown) that drives the electronic device 600 may provide the third selection signal SS3 to the third selector 623. Latency when the third selector 623 selects the second detection signal DS2 may be different from latency when the aligned detection signal ADS is selected. In other words, when the third selector 623 selects the aligned detection signal ADS, the equalizer 621 and the phase detector 622 are not used, and thus latency for generating a clock signal CLK may be reduced. In addition, because the latency for generating a clock signal CLK may be reduced, the bandwidth of the electronic device 600 may be increased.

The digital loop filter 624 may perform low-pass filtering on the signal selected by the third selector 623 to generate a filtered detection signal FDS.

The digital signal processor 620 may generate an output signal OUT including the digital signal DIGITAL received from the analog-to-digital converters 610a and the first frequency-divided clock signal D_CLK1 received from the digitally controlled oscillator 640.

The phase interpolator 650 may generate multi-phase clock signals MP_CLK by adjusting the phase of a clock signal CLK. In some example embodiments, the electronic device 600 may desire or require multi-phase clock signals MP_CLK. For example, when M is 4, the electronic device 600 may desire or require a clock having four phases. In some example embodiments, when the digitally controlled oscillator 640 generates clock signals CLK having two phases, the phase interpolator 650 may adjust the phase of a clock signal CLK received from the digitally controlled oscillator 640 to generate multi-phase clock signals MP_CLK having four phases.

The first selector 630 may select one of the clock signal CLK and the multi-phase clock signals MP_CLK in response to a first selection signal SS1. The first selection signal SS1 may be provided to the first selector 630 by the processor (not shown) that drives the electronic device 600. When the digitally controlled oscillator 640 generates clock signals CLK having two phases and the electronic device 600 operates based on clock signals CLK having four phases, the first selector 630 may select the multi-phase clock signals MP_CLK in response to the first selection signal SS1. In addition, when the digitally controlled oscillator 640 generates clock signals CLK having two phases and the electronic device 600 operates based on the clock signals CLK having two phases, the first selector 630 may select the clock signals CLK.

The second selector 660 may select one of the first logic decision signal LDS1 and the second logic decision signal LDS2 in response to a second selection signal SS2. The second selection signal SS2 may be provided to the second selector 660 by the processor (not shown) that drives the electronic device 600. When a frequency corresponding to the input signal INPUT is half as high as the frequency of the second frequency-divided clock signal D_CLK2, the electronic device 600 may not use the second sampler 612a and may sample data and edges of the input signal INPUT by only using the first sampler 611a. In some example embodiments, the second selector 660 may select the first logic decision signal LDS1 in response to the second selection signal SS2. In addition, when a frequency corresponding to the input signal INPUT is equal to or higher than the frequency of the second frequency-divided clock signal D_CLK2, the second selector 660 may select the second logic decision signal LDS2.

The switch 690 may have one end electrically connected to the analog bang-bang phase detector 670 and the other end electrically connected to the digitally controlled oscillator 640. The switch 690 may switch an electrical connection between the analog bang-bang phase detector 670 and the digitally controlled oscillator 640 according to an operation mode signal OMS provided from the processor (not shown). When the operation mode signal OMS has a dual control mode voltage level corresponding to a dual control mode, the switch 690 may electrically connect the analog bang-bang phase detector 670 and the digitally controlled oscillator 640 to each other. In addition, when the operation mode signal OMS has a single control mode voltage level corresponding to a single control mode, the switch 690 may electrically disconnect the analog bang-bang phase detector 670 and the digitally controlled oscillator 640 from each other.

When the digitally controlled oscillator 640 outputs a clock signal CLK, the frequency of the clock signal CLK may vary according to the operation mode signal OMS. When the operation mode signal OMS has the dual control mode voltage level corresponding to the dual control mode, the first detection signal DS1 and the filtered detection signal FDS may be provided to the digitally controlled oscillator 640. The digitally controlled oscillator 640 may generate a clock signal CLK having a frequency shifted by a frequency shift amount corresponding to the first detection signal DS1 and the filtered detection signal FDS.

When the operation mode signal OMS has the single control mode voltage level corresponding to the single control mode, the filtered detection signal FDS may be provided to the digitally controlled oscillator 640. The digitally controlled oscillator 640 may generate a clock signal CLK having a frequency varied according to the filtered detection signal FDS.

As described above, when the third selector 623 selects the aligned detection signal ADS, the electronic device 600 may restore a clock signal with a lower latency than when the second detection signal DS2 is selected. In addition, when the electronic device 600 restores a clock signal with a low latency, the bandwidth of the electronic device 600 may be increased.

FIGS. 7A and 7B are timing diagrams illustrating a data clock and an edge clock according to some example embodiments.

FIG. 7A is a timing diagram illustrating a data clock DATA CLOCK for sampling data of an input signal INPUT, and FIG. 7B is a timing diagram illustrating an edge clock EDGE CLOCK for sampling edges of the input signal INPUT. FIGS. 7A and 7B may be described with reference to FIG. 6.

The data clock DATA CLOCK illustrated in FIG. 7A may be a full rate clock having the same or substantially the same period as the period of the input signal INPUT. According to some example embodiments, the data clock DATA CLOCK may include multi-phase clock signals A1, A2, A3, and A4. In other words, the data clock DATA CLOCK shown in FIG. 7A may include first to fourth multi-phase clock signals A1, A2, A3, and A4 having a frequency of ¼ and different phases. In some example embodiments, rising edges of the first to fourth multi-phase clock signals A1, A2, A3, and A4 may correspond to rising edges of the data clock DATA CLOCK in a 1:1 relationship. An electronic device may sample the input signal INPUT at a low clock rate by implementing the data clock DATA CLOCK with the first to fourth multi-phase clock signals A1, A2, A3, and A4. For example, the second frequency-divided clock signal D_CLK2 described with reference to FIG. 6 may include the first to fourth multi-phase clock signals A1, A2, A3, and A4. That is, the second frequency-divided clock signal D_CLK2 may be a signal for sampling data of the input signal INPUT.

The edge clock EDGE CLOCK shown in FIG. 7B may be a full-rate clock having the same or substantially the same period as the period of the input signal INPUT. According to some example embodiments, like the data clock DATA CLOCK, the edge clock EDGE CLOCK may also include multi-phase clock signals B1, B2, B3, and B4. The edge clock EDGE CLOCK shown in FIG. 7B may include first to fourth multi-phase clock signals B1, B2, B3, and B4 having a frequency of ¼ and different phases. In some example embodiments, rising edges of the first to fourth multi-phase clock signals B1, B2, B3, and B4 may correspond to rising edges of the edge clock EDGE CLOCK in a 1:1 relationship. An electronic device may sample edges of the input signal INPUT at a low clock rate by implementing the edge clock EDGE CLOCK with the first to fourth multi-phase clock signals B1, B2, B3, and B4. For example, the third frequency-divided clock signal D_CLK3 described with reference to FIG. 6 may include the first to fourth multi-phase clock signals B1, B2, B3, and B4. That is, the third frequency-divided clock signal D_CLK3 may be a signal for sampling edges of the input signal INPUT.

Figure 8:
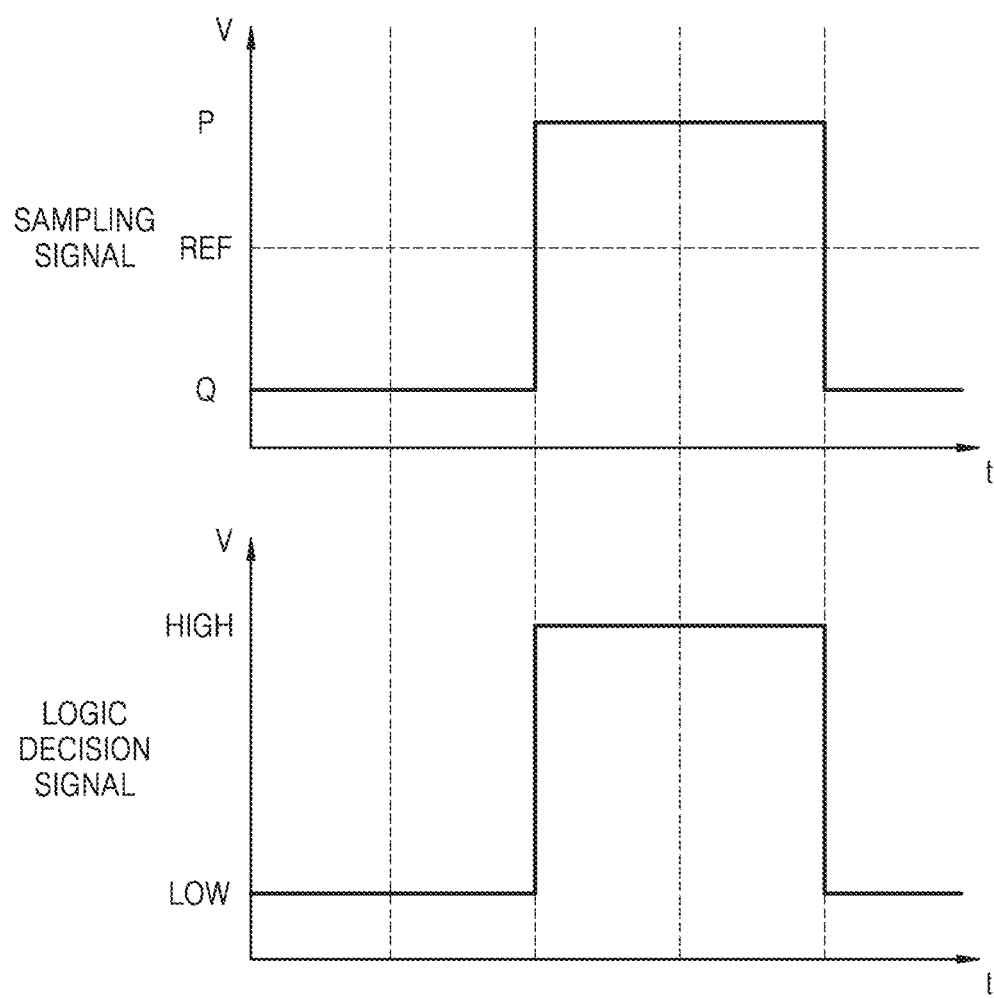
FIG. 8 is a diagram illustrating an operation of a comparator according to an example embodiment.

FIG. 8 is a diagram illustrating operations of the comparator 212 according to an example embodiment. FIG. 8 may be described with reference to FIG. 2.

Referring to FIG. 8, the comparator 212 may generate a logic decision signal LDS by comparing the voltage level of a sampling signal SAMP with a reference voltage level REF. For example, the comparator 212 may generate a logic decision signal LDS corresponding to a high level or a low level by comparing the voltage level of the sampling signal SAMP with the reference voltage level REF. For example, when the voltage level of the sampling signal SAMP is P [V], the comparator 212 may generate a logic decision signal LDS corresponding to a high logic level because the voltage level of the sampling signal SAMP is higher than the reference voltage level REF. In addition, when the voltage level of the sampling signal SAMP is Q [V], the comparator 212 may generate a logic decision signal LDS corresponding to a low logic level because the voltage level of the sampling signal SAMP is lower than the reference voltage level REF. However, this is merely an example, and the comparator 212 may generate a logic decision signal LDS corresponding to a low logic level when the voltage level of the sampling signal SAMP is higher than the reference voltage level REF, and a logic decision signal LDS corresponding to a high logic level when the voltage level of the sampling signal SAMP is lower than the reference voltage level REF.

Figure 9A:
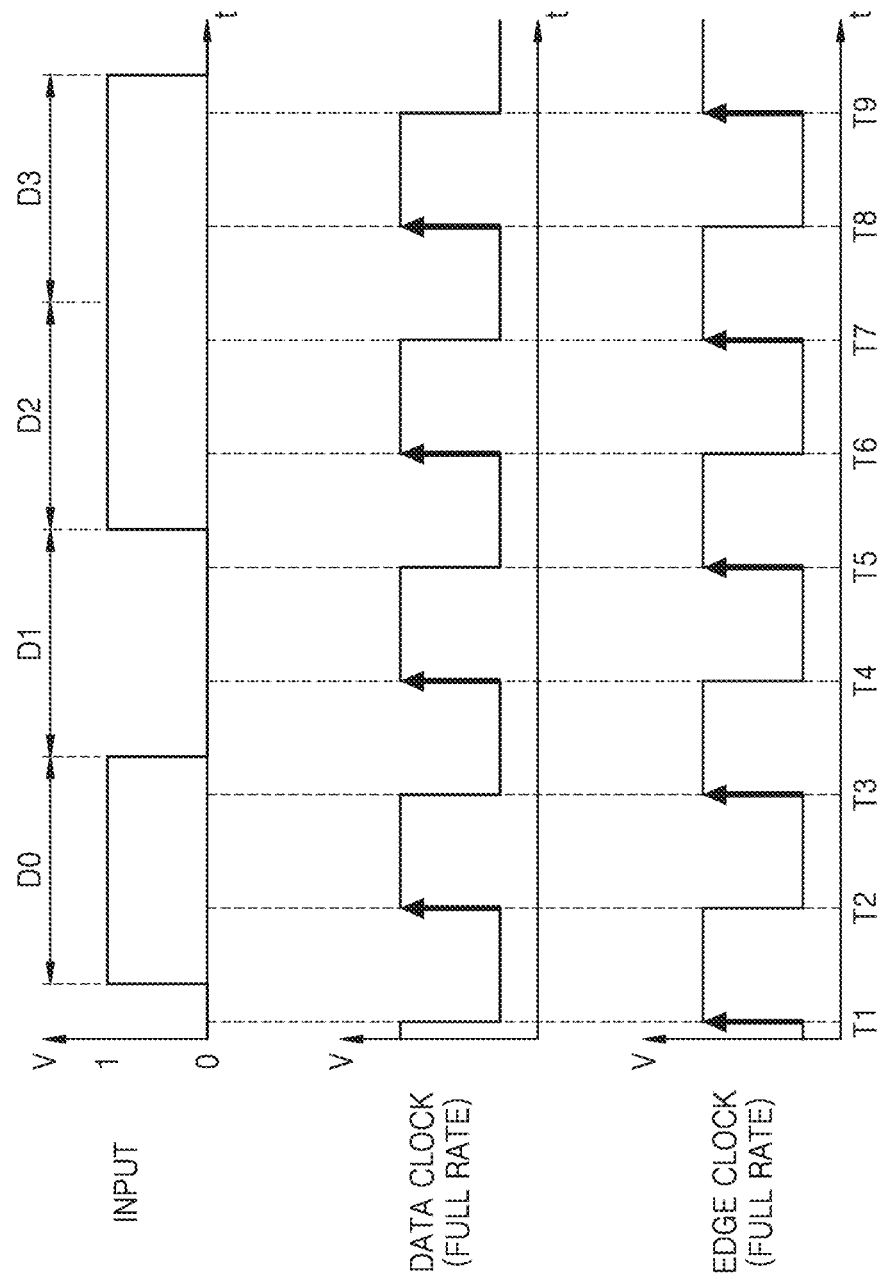
FIGS. 9A and 9B are diagrams illustrating operations of an analog bang-bang phase detector according to example embodiments.
Figure 9B:
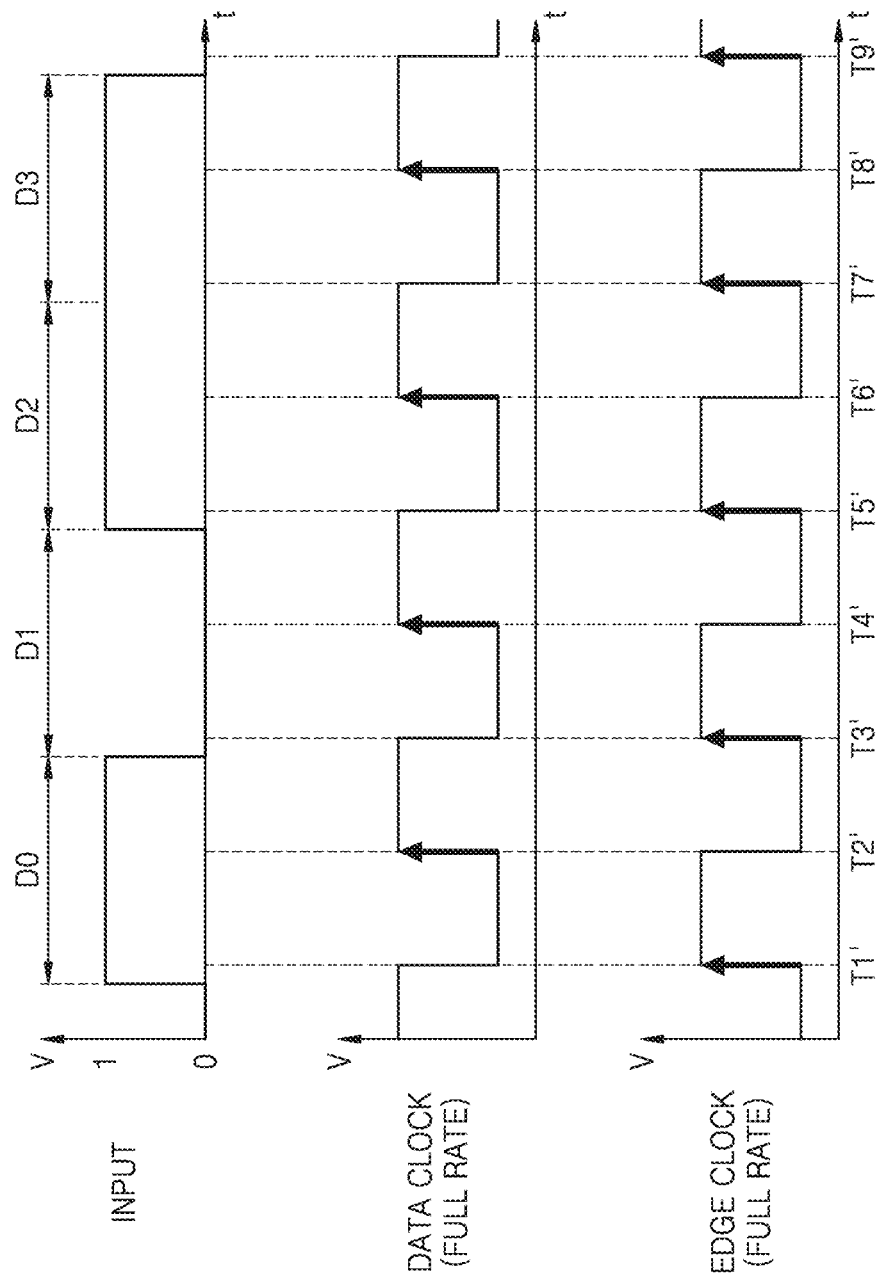

FIGS. 9A and 9B are diagrams illustrating operations of the analog bang-bang phase detector 670 according to embodiments. FIGS. 9A and 9B may be described with reference to FIG. 6. FIG. 9A shows an example in which the analog bang-bang phase detector 670 decreases the frequency of a clock signal CLK, and FIG. 9B shows an example in which the analog bang-bang phase detector 670 increases the frequency of a clock signal CLK. A data clock DATA CLOCK shown in FIG. 9A may correspond to the second frequency-divided clock signal D_CLK2 shown in FIG. 6, and an edge clock EDGE CLOCK shown in FIG. 9A may correspond to the third frequency-divided clock signal D_CLK3 shown in FIG. 6. In FIGS. 9A and 9B, it is assumed that the second selector 660 shown in FIG. 6 selects the second logic decision signal LDS2 in response to the second selection signal SS2.

At T1 in FIG. 9A, the second sampler 612a may generate a second sampling signal SAMP2 corresponding to 0 in response to a rising edge of the edge clock EDGE CLOCK. The second comparator 614a may compare the second sampling signal SAMP2 with a reference voltage level, and when the voltage level of the second sampling signal SAMP2 is lower than the reference voltage level, the second comparator 614a may generate a second logic decision signal LDS2 corresponding to a low logic level. Similarly, the second sampler 612a may generate a second sampling signal SAMP2 corresponding to 1 at T3, T7, and T9, and the second comparator 614a may generate a second logic decision signal LDS2 corresponding to a high logic level. In addition, the second sampler 612a may generate a second sampling signal SAMP2 corresponding to 0 at T5, and the second comparator 614a may generate a second logic decision signal LDS2 corresponding to a low logic level. In other words, successive samples of the second logic decision signal LDS2 at T1, T3, T5, T7, and T9 may be 01011 (where 0 corresponds to a low logic level, and 1 corresponds to a high logic level).

At T2 in FIG. 9A, the first sampler 611a may generate a first sampling signal SAMP1 corresponding to 1 in response to a rising edge of the data clock DATA CLOCK. The first comparator 615a may compare the first sampling signal SAMP1 with the reference voltage level, and when the voltage level of the first sampling signal SAMP1 is higher than the reference voltage level, the first comparator 615a may generate a first logic decision signal LDS1 corresponding to a high logic level. Similarly, at T6 and T8, the first sampler 611a may generate a first sampling signal SAMP1 corresponding to 1, and the first comparator 615a may generate a first logic decision signal LDS1 corresponding to a high logic level. In addition, at T4, the first sampler 611a may generate a first sampling signal SAMP1 corresponding to 0, and the first comparator 615a may generate a first logic decision signal LDS1 corresponding to a low logic level. In other words, successive samples of the first logic decision signal LDS1 at T2, T4, T6, and T8 may be 1011 (where 0 corresponds to a low logic level, and 1 corresponds to a high logic level).

In some example embodiments, the analog bang-bang phase detector 670 may generate a first detection signal DS1 through an XOR operation between successive samples of the first logic decision signal LDS1 and successive samples of the second logic decision signal LDS2. For example, an XOR operation between 0101, which is a second logic decision signal LDS2 corresponding to T1, T3, T5, and T7, and 1011, which is a first logic decision signal LDS1 corresponding to T2, T4, T6, and T8 may result in 1110, which is a first detection signal DS1. A first detection signal DS1 corresponding to 1 may be referred to as a down-detection signal indicating that the frequency of the data clock DATA CLOCK and the edge clock EDGE CLOCK is to be decreased because the frequency of the data clock DATA CLOCK and the edge clock EDGE CLOCK is higher than a frequency corresponding to the input signal INPUT. In addition, a first detection signal DS1 corresponding to 0 may be referred to as an up-detection signal indicating that the frequency of the data clock DATA CLOCK and the edge clock EDGE CLOCK is to be increased because the frequency of the data clock DATA CLOCK and the edge clock EDGE CLOCK is lower than a frequency corresponding to the input signal INPUT. As a result, the analog bang-bang phase detector 670 may sequentially output first detection signals DS1, that is, 1110, and thus the frequency of a clock signal CLK may be reduced by 2 units. The size of a unit based on which the frequency of the clock signal CLK is varied may be set differently according to different example embodiments.

In some example embodiments, an XOR operation between the second logic decision signals LDS2 corresponding to T1, T3, T5, and T7 and the first logic decision signals LDS1 corresponding to T2, T4, T6, and T8 is described as an example. However, this is merely an example. For example, first detection signals DS1 may be generated through an XOR operation between second logic decision signals LDS2 corresponding to T3, T5, T7, and T9, and first logic decision signals LDS1 corresponding to T2, T4, T6, and T8. In some example embodiments, however, a first detection signal DS1 corresponding to 0 may be referred to as a down-detection signal, and a first detection signal DS1 corresponding to 1 may be referred to as an up-detection signal.

At T1' in FIG. 9B, the second sampler 612a may generate a second sampling signal SAMP2 corresponding to 1 in response to a rising edge of an edge clock EDGE CLOCK. The second comparator 614a may compare the second sampling signal SAMP2 with the reference voltage level, and when the voltage level of the second sampling signal SAMP2 is higher than the reference voltage level, the second comparator 614a may generate a second logic decision signal LDS2 corresponding to a high logic level. Similarly, at T5' and T7', the second sampler 612a may generate second sampling signals SAMP2 corresponding to 1, and the second comparator 614a may generate second decision signals LDS2 corresponding to a high logic level. In addition, at T3' and T9', the second sampler 612a may generate a second sampling signal SAMP2 corresponding to 0, and the second comparator 614a may generate a second logic decision signal LDS2 corresponding to a low logic level. In other words, successive samples of the second logic decision signals LDS2 at T1', T3', T5', T7', and T9' may be 10110 (where 0 corresponds to a low logic level, and 1 corresponds to a high logic level).

At T2' in FIG. 9B, the first sampler 611a may generate a first sampling signal SAMP1 corresponding to 1 in response to a rising edge of a data clock DATA CLOCK. The first comparator 615a may compare the first sampling signal SAMP1 with the reference voltage level, and when the voltage level of the first sampling signal SAMP1 is higher than the reference voltage level, the first comparator 615a may generate a first logic decision signal LDS1 corresponding to a high logic level. Similarly, at T6' and T8', the first sampler 611a may generate first sampling signals SAMP1 corresponding to 1, and the first comparator 615a may generate first logic decision signals LDS1 corresponding to a high logic level. In addition, at T4', the first sampler 611a may generate a first sampling signal SAMP1 corresponding to 0, and the first comparator 615a may generate a first logic decision signal LDS1 corresponding to a low logic level. In other words, successive samples of the first logic decision signals LDS1 at T2', T4', T6', and T8' may be 1011 (where 0 corresponds to a low logic level, and 1 corresponds to a high logic level).

In some example embodiments, the analog bang-bang phase detector 670 may generate first detection signals DS1 through an XOR operation between successive samples of the first logic decision signals LDS1 and successive samples of the second logic decision signals LDS2. For example, an XOR operation between 1011, which is the second logic decision signals LDS2 corresponding to T1', T3', T5', and T7', and 1011, which is the first logic decision signals LDS1 corresponding to T2', T4', T6', and T8', may result in 0000 as first detection signals DS1. A first detection signal DS1 corresponding to 1 may be referred to as a down-detection signal indicating that the frequency of the data clock DATA CLOCK and the edge clock EDGE CLOCK is to be decreased because the frequency of the data clock DATA CLOCK and the edge clock EDGE CLOCK is higher than a frequency corresponding to an input signal INPUT. In addition, a first detection signal DS1 corresponding to 0 may be referred to as an up-detection signal indicating that the frequency of the data clock DATA CLOCK and the edge clock EDGE CLOCK is to be increased because the frequency of the data clock DATA CLOCK and the edge clock EDGE CLOCK is lower than a frequency corresponding to the input signal INPUT. As a result, the analog bang-bang phase detector 670 may sequentially output the first detection signals DS1, that is, 0000, and thus the frequency of a clock signal CLK may be reduced by 4 units.

In some example embodiments, an XOR operation between the second logic decision signals LDS2 corresponding to T1', T3', T5', and T7' and the first logic decision signals LDS1 corresponding to T2', T4', T6', and T8' is described as an example. However, this is merely an example. For example, first detection signals DS1 may be generated through an XOR operation between second logic decision signals LDS2 corresponding to T3', T5', T7', and T9', and first logic decision signals LDS1 corresponding to T2', T4', T6', and T8'. In some example embodiments, however, a first detection signal DS1 corresponding to 0 may be referred to as a down-detection signal, and a first detection signal DS1 corresponding to 1 may be referred to as an up-detection signal.

FIG. 10 is a diagram illustrating a first detection signal according to an example embodiment.

FIG. 10 may be described with reference to FIGS. 6, 9A, and 9B. FIG. 10 illustrates a first detection signal DS1 with respect to time, and the first detection signal DS1 may be referred to as an up-detection signal or a down-detection signal. As described above with reference to FIGS. 9A and 9B, the analog bang-bang phase detector 670 may sequentially generate the first detection signals DS1 through an XOR operation between a first logic decision signal LDS1 and a second logic decision signal LDS2. Although FIG. 10 illustrates that the first detection signals DS1 is output 16 times in total, this is merely an example, and example embodiments are not limited thereto.

Figure 11:
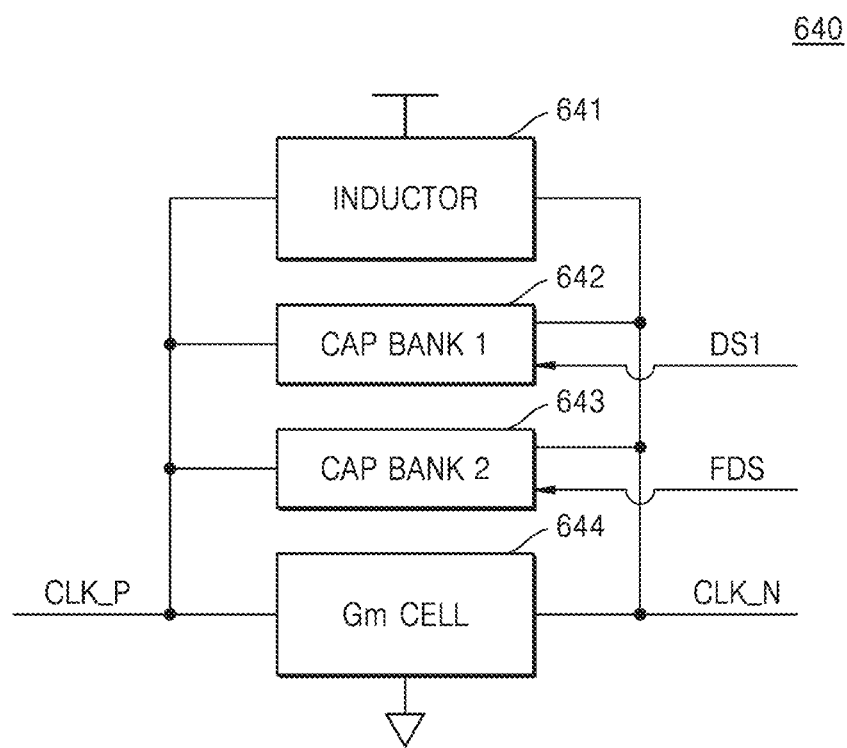
FIG. 11 is a diagram illustrating a digitally controlled oscillator according to an example embodiment.

FIG. 11 is a diagram illustrating the digitally controlled oscillator 640 according to an example embodiment.

Referring to FIG. 11, the digitally controlled oscillator 640 may include an inductor 641, a first capacitor bank 642, a second capacitor bank 643, and a Gm cell 644. The digitally controlled oscillator 640 shown in FIG. 11 may be referred to as an LC-digitally-controlled oscillator because the digitally controlled oscillator 640 includes the inductor 641 having an inductance component such as a coil, and the first and second capacitor banks 642 and 643 having capacitance components.

The inductor 641 may have an inductance value for outputting clock signals CLK_P and CLK_N having frequencies according to the capacitance values of the first capacitor bank 642 and the second capacitor bank 643.

A first detection signal DS1 may have an up-count voltage level or a down-count voltage level corresponding to thermometer code information, and the first capacitor bank 642 may store the thermometer code information. The thermometer code information may refer to information indicated according to the numbers of 1's and 0's regardless of the places of digits. For example, when the thermometer code information is 01111101 or 11111010, the number of 1's is 6 and the number of 0's is 2, and thus the digitally controlled oscillator 640 may decrease the frequency of a clock signal by 4 units. The first capacitor bank 642 may include capacitors corresponding to the number of bits of the thermometer code information. For example, when the thermometer code information has 8 bits, the first capacitor bank 642 may include 8 capacitors.

In some example embodiments, the digitally controlled oscillator 640 may mask and store the thermometer code information to adjust the bandwidth of the electronic device 600. For example, when the thermometer code information is 01111101, odd-numbered thermometer code information "0110" may not be saved (may be masked), and only even-numbered thermometer code information "1111" may be stored.

A filtered detection signal FDS may have a binary voltage level corresponding to binary code information, and the second capacitor bank 643 may store the binary code information. The binary code information may include information corresponding to 1, 2, 4, 8, . . . $2^n$ from the lowest digit (where n is an integer greater than or equal to 0). For example, when the binary code information is 0000, the digitally controlled oscillator 640 may increase the frequency of a clock signal by 8 units, and when the binary code information is 1010, the digitally controlled oscillator 640 may decrease the frequency of a clock signal by 2 units. The second capacitor bank 643 may include capacitors corresponding to the number of bits of the binary code information. For example, when the binary code information has 4 bits, the second capacitor bank 643 may include four capacitors.

The Gm cell 644 may generate power to drive the digitally controlled oscillator 640. The Gm cell 644 may also be referred to as a current source.

The digitally controlled oscillator 640 may generate the clock signals CLK_P and CLK_N after varying the frequencies of the clock signals CLK_P and CLK_N according to the first detection signal DS1 and the filtered detection signal FDS. Referring to FIG. 11, the clock signals CLK_P and CLK_N may be implemented as two signals having opposite phases. Here, the two signals may be referred to as a positive clock signal CLK_P and a negative clock signal CLK_N. The positive clock signal CLK_P and the negative clock signal CLK_N may have opposite phases, and in this case, the positive clock signal CLK_P and the negative clock signal CLK_N may be referred to as differential clock signals.

Figure 12:
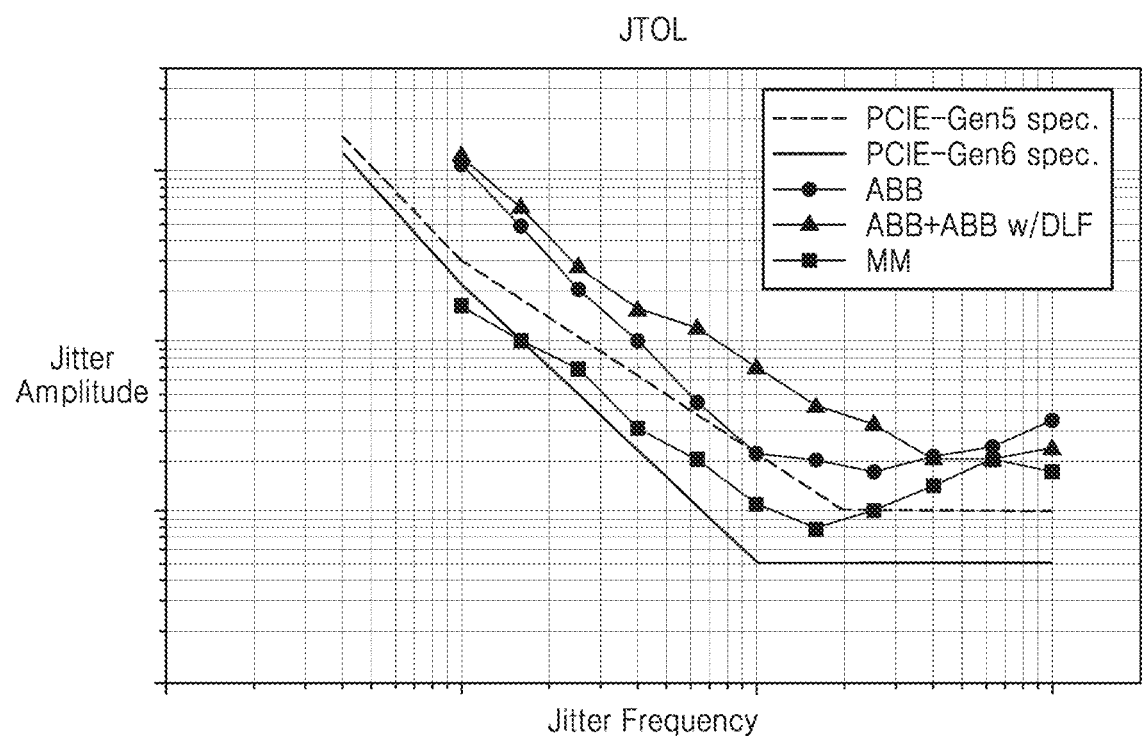
FIG. 12 is a diagram illustrating a jitter amplitude and a jitter frequency, according to an example embodiment.

FIG. 12 is a diagram illustrating a jitter amplitude and a jitter frequency according to an example embodiment. FIG. 12 may be described with reference to FIG. 6.

FIG. 12 illustrates: PCIe generation 5 specifications (PCIE-Gen5 spec); PCIe generation 6 specifications (PCIE-Gen6 spec); ABB (single control mode) in which a first detection signal DS1 output by the analog bang-bang phase detector 670 is applied to the digitally controlled oscillator 640; ABB+ABB w/DLF (dual control mode) in which a first detection signal DS1 output by the analog bang-bang phase detector 670 and a filtered detection signal FDS output by the digital loop filter 624 are applied to the digitally controlled oscillator 640; and MM in which the third selector 623 shown in FIG. 6 selects a second detection signal DS2 and uses the equalizer 621 and the phase detector 622.

Each curve shown in FIG. 12 represent the maximum restorable jitter frequency and the maximum restorable jitter amplitude. In other words, when jitter having a frequency greater than the curves shown in FIG. 12 or jitter having an amplitude greater than the curves shown in FIG. 12 is applied to the electronic device 600, the electronic device 600 may not restore a clock signal CLK from an input signal INPUT.

As shown in FIG. 12, both in the single control mode (ABB) and the dual control mode (ABB+ABB w/DLF), the electronic device 600 may satisfy jitter specifications desired or required by PCIE-Gen5 spec and PCIE-Gen6 spec.

FIG. 13 is a diagram illustrating a digital signal according to an example embodiment. FIG. 13 may be described with reference to FIG. 6.

FIG. 13 illustrates the frequency of an input signal INPUT and the amplitude of a digital signal DIGITAL with respect to time. The digital signal DIGITAL shown in FIG. 13 may be a signal having four amplitude levels according to pulse amplitude modulation 4-level (PAM4).

Referring to FIG. 13, even when the frequency of the input signal INPUT varies due to jitter included in the input signal INPUT after T0, the digital signal DIGITAL, which is output from the analog-to-digital converters 610a, may have four stable amplitude levels.

Figure 14:
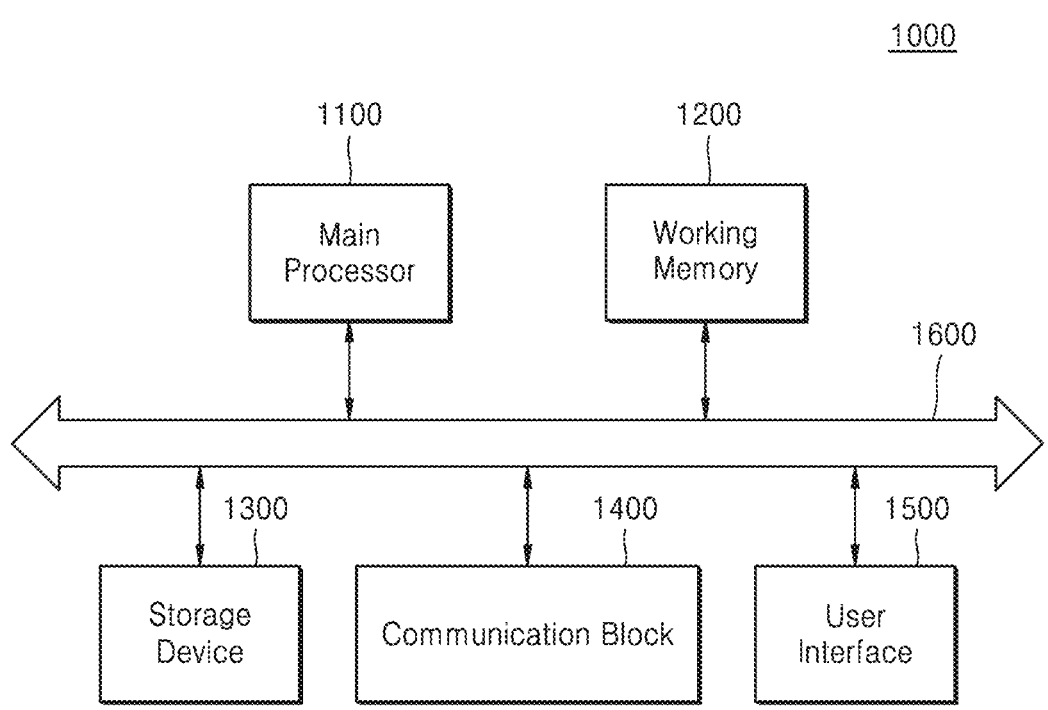
FIG. 14 is a diagram illustrating an electronic system according to an example embodiment.

FIG. 14 is a diagram illustrating an electronic system 1000 according to an example embodiment. The electronic system 1000 may include a main processor 1100, a working memory 1200, a storage device 1300, a communication block 1400, a user interface 1500, and a bus 1600. For example, the electronic system 1000 may be one of electronic apparatuses such as a desktop computer, a laptop computer, a tablet computer, a smartphone, a wearable device, an electric vehicle, a workstation, or the like. The electronic system 1000 may be an electronic apparatus for end-users or may be a component of a large-scale system such as a server system or a data center.

The main processor 1100 may control overall operations of the electronic system 1000. The main processor 1100 may process various types of arithmetic operations and/or logical operations. For example, the main processor 1100 may be implemented as a general-purpose processor, a dedicated processor, or an application processor, but example embodiments are not limited thereto.

The working memory 1200 may store data for the operation of the electronic system 1000. For example, the working memory 1200 may temporarily store data processed or to be processed by the main processor 1100. For example, the working memory 1200 may include a volatile memory such as a dynamic random access memory (DRAM) or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM), but example embodiments are not limited thereto.

A memory device of the storage device 1300 may retain data even after power is removed therefrom. For example, the storage device 1300 may include a nonvolatile memory such as a flash memory, a PRAM, an MRAM, an ReRAM or an FRAM. For example, the storage device 1300 may include a storage medium such as a hard disk drive (HDD), a solid state drive (SSD), a card storage, or an embedded storage.

The communication block 1400 may communicate with external devices/systems provided outside the electronic system 1000. The communication block 1400 may be a component capable of providing communication services, such as a modulator/demodulator (MODEM) chip or device, a network card, a communication switch, a hub, or a router. For example, the communication block 1400 may support at least one of various wireless communication protocols such as LTE, worldwide interoperability for microwave access (WiMAX), global system for mobile communication (GSM), code-division multiple access (CDMA), Bluetooth, near field communication (NFC), Wi-Fi, or RFID, and/or at least one of various wired communication protocols such as transmission control protocol/Internet protocol (TCP/IP), universal serial bus (USB), or Fire Wire.

The communication block 1400 may generate a first sampling signal by sampling an input signal in response to edges of a clock signal, compare the voltage level of the first sampling signal with a reference voltage level to generate a first logic decision signal, generate a first detection signal based on the first logic decision signal, and generate a clock signal having a frequency adjusted according to the first detection signal.

In some example embodiments, the communication block 1400 may generate an aligned detection signal by aligning the timing of the first detection signal and may generate a filtered detection signal by low-pass filtering the aligned detection signal.

In another example embodiment, when an operation mode signal received from the main processor 1100 has a dual control mode voltage level corresponding to a dual control mode, the communication block 1400 may generate a clock signal having a frequency adjusted according to the first detection signal and the filtered detection signal.

In another example embodiment, when the operation mode signal received from the main processor has a single control mode voltage level corresponding to a single control mode, the communication block 1400 may generate a clock signal having a frequency adjusted according to the filtered detection signal.

The user interface 1500 may mediate communication between a user and the electronic system 1000. For example, the user interface 1500 may include an input interface such as a keyboard, a mouse, a keypad, a button, a touch panel, a touch screen, a touch pad, a touch ball, a camera, a microphone, a gyroscope sensor, a vibration sensor, or the like. For example, the user interface 1500 may include an output interface such as a liquid crystal display (LCD) device, a light-emitting diode (LED) display device, an organic LED (OLED) display device, an active matrix OLED (AMOLED) display device, a speaker, a motor, or the like.

The bus 1600 may provide a communication path between components of the electronic system 1000. The components of the electronic system 1000 may exchange data with each other based on the bus format of the bus 1600. For example, the bus format may include one or more of various interface protocols such as USB, small computer system interface (SCSI), PCIe, mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), or universal flash storage (UFS).

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the scope of the inventive concepts.

What is claimed is:

1. An electronic device comprising:
   a first sample circuit configured to generate a first sampling signal by sampling an input signal in response to edges of a clock signal;
   a first comparator configured to generate a first logic decision signal by comparing a voltage level of the first sampling signal with a reference voltage level;
   an analog bang-bang phase detector configured to generate a first detection signal by executing an exclusive OR (XOR) operation on successive samples of the first logic decision signal; and
   a digitally controlled oscillator configured to vary a frequency of the clock signal according to the first detection signal.

2. The electronic device of claim 1, wherein
   the first detection signal includes an up-count voltage level or a down-count voltage level corresponding to thermometer code information, and
   the digitally controlled oscillator comprises a capacitor bank configured to store the thermometer code information.

3. The electronic device of claim 1, further comprising:
   a second sample circuit configured to generate a second sampling signal by sampling the input signal in response to edges of an inverted clock signal, the inverted clock signal having a phase opposite to a phase of the clock signal;
   a second comparator configured to generate a second logic decision signal by comparing a voltage level of the second sampling signal with the reference voltage level; and
   a selector configured to select one of the first logic decision signal and the second logic decision signal in response to a selection signal, wherein
   when the first logic decision signal is selected, the analog bang-bang phase detector is configured to generate the first detection signal by executing the XOR operation on the successive samples of the first logic decision signal, and
   when the second logic decision signal is selected, the analog bang-bang phase detector is configured to generate the first detection signal by executing the XOR operation on successive samples of the first logic decision signal and successive samples of the second logic decision signal.

4. The electronic device of claim 1, further comprising:
   a phase interpolator configured to generate multi-phase clock signals by adjusting a phase of the clock signal;
   a selector configured to select one of the clock signal and the multi-phase clock signals in response to a selection signal; and
   a clock divider configured to divide a frequency of the signal selected by the selector and output frequency-divided clock signals.

5. The electronic device of claim 1, further comprising:
   a second sample circuit configured to generate a delayed sampling signal by sampling the first sampling signal;
   an analog-to-digital converter configured to convert the delayed sampling signal into a digital signal; and
   a digital signal processor configured to generate an output signal by processing the digital signal.

6. The electronic device of claim 5, further comprising a re-timer configured to generate an aligned detection signal by aligning timing of the first detection signal and provide the aligned detection signal to the digital signal processor, wherein the digital signal processor comprises a digital loop filter configured to generate a filtered detection signal by low-pass filtering the aligned detection signal and provide the filtered detection signal to the digitally controlled oscillator.

7. The electronic device of claim 6, wherein
   the filtered detection signal has a binary voltage level corresponding to binary code information, and
   the digitally controlled oscillator comprises a capacitor bank configured to store the binary code information.

8. The electronic device of claim 6, further comprising a switch having one end electrically connected to the analog bang-bang phase detector and another end electrically connected to the digitally controlled oscillator, the switch configured to switch an electrical connection between the analog bang-bang phase detector and the digitally controlled oscillator according to an operation mode signal.

9. The electronic device of claim 6, wherein the digital signal processor further comprises:
   an equalizer configured to generate an equalized digital signal by equalizing attenuations of components of the digital signal;
   a phase detector configured to detect a phase difference between the equalized digital signal and the digital signal and generate a second detection signal corresponding to the phase difference; and
   a selector configured to provide one of the second detection signal and the aligned detection signal to the digital loop filter in response to a selection signal.

10. An operating method of an electronic device comprising an analog bang-bang phase detector, the operating method comprising:

generating a first sampling signal by sampling an input signal in response to edges of a clock signal;

generating a first logic decision signal by comparing a voltage level of the first sampling signal with a reference voltage level;

generating a first detection signal by the analog bang-bang phase detector performing an exclusive OR (XOR) operation on successive samples of the first logic decision signal; and varying a frequency of the clock signal according to the first detection signal.

11. The operating method of claim 10, further comprising:

generating a second sampling signal by sampling the input signal in response to edges of an inverted clock signal having a phase opposite to a phase of the clock signal;

generating a second logic decision signal by comparing a voltage level of the second sampling signal with the reference voltage level; and providing one of the first logic decision signal and the second logic decision signal to the analog bang-bang phase detector in response to a selection signal.

12. The operating method of claim 10, further comprising:

generating multi-phase clock signals by adjusting a phase of the clock signal; and generating frequency-divided clock signals by dividing a frequency of any one of the clock signal and the multi-phase clock signals.

13. The operating method of claim 10, further comprising:

generating a delayed sampling signal by sampling the first sampling signal;

converting the delayed sampling signal into a digital signal; and generating an output signal by signal processing the digital signal.

14. The operating method of claim 10, further comprising:

generating an aligned detection signal by aligning timing of the first detection signal; and generating a filtered detection signal by low-pass filtering the aligned detection signal.

15. The operating method of claim 14, wherein when an operation mode signal has a dual control mode voltage level corresponding to a dual control mode, the operating method further comprises generating a clock signal having a frequency adjusted according to the first detection signal and the filtered detection signal.

16. The operating method of claim 14, wherein when an operation mode signal has a single control mode voltage level corresponding to a single control mode, the operating method further comprises generating a clock signal having a frequency adjusted according to the filtered detection signal.

17. An electronic system comprising:

a communication block configured to receive an input signal from a system external to the electronic system; and a main processor configured to process at least one of arithmetic or logical operations in the electronic system, wherein the communication block is configured to:

generate a first sampling signal by sampling the input signal in response to edges of a clock signal;

generate a first logic decision signal by comparing a voltage level of the first sampling signal with a reference voltage level;

generate a first detection signal, based on the first logic decision signal; and generate a clock signal having a frequency adjusted according to the first detection signal.

18. The electronic system of claim 17, wherein the communication block is configured to:

generate an aligned detection signal by aligning timing of the first detection signal; and generate a filtered detection signal by low-pass filtering the aligned detection signal.

19. The electronic system of claim 18, wherein when an operation mode signal received from the main processor has a dual control mode voltage level corresponding to a dual control mode, the communication block is configured to generate a clock signal having a frequency adjusted according to the first detection signal and the filtered detection signal.

20. The electronic system of claim 18, wherein when an operation mode signal received from the main processor has a single control mode voltage level corresponding to a single control mode, the communication block is configured to generate a clock signal having a frequency adjusted according to the filtered detection signal.

\* \* \* \* \*